(12) United States Patent
Watanabe et al.

(10) Patent No.: US 8,009,222 B2
(45) Date of Patent: Aug. 30, 2011

(54) IMAGE PICKUP APPARATUS AND METHOD OF MANUFACTURING THE SAME

(75) Inventors: Naoyuki Watanabe, Kawasaki (JP); Toshiyuki Honda, Kawasaki (JP); Noboru Hayasaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 663 days.

(21) Appl. No.: 11/338,856

(22) Filed: Jan. 25, 2006

(65) Prior Publication Data

US 2007/0091198 A1   Apr. 26, 2007

(30) Foreign Application Priority Data

Oct. 21, 2005   (JP) .................................. 2005-307893

(51) Int. Cl.
*H04N 5/225* (2006.01)
*H04N 11/04* (2006.01)

(52) U.S. Cl. ......... 348/340; 348/335; 348/360; 348/438

(58) Field of Classification Search .................. 348/340, 348/86, 374, 335, 360, 438
See application file for complete search history.

(56) References Cited

U.S. PATENT DOCUMENTS

| | | | |
|---|---|---|---|
| 2001/0015767 A1* | 8/2001 | Miyake | 348/374 |
| 2001/0050717 A1* | 12/2001 | Yamada et al. | 348/340 |
| 2002/0154239 A1* | 10/2002 | Fujimoto et al. | 348/340 |
| 2004/0061799 A1* | 4/2004 | Atarashi et al. | 348/340 |
| 2004/0109079 A1* | 6/2004 | Fujimoto et al. | 348/340 |
| 2005/0041134 A1* | 2/2005 | Takayama | 348/340 |
| 2005/0237418 A1* | 10/2005 | Sakamoto | 348/340 |
| 2006/0146170 A1* | 7/2006 | Saito et al. | 348/340 |
| 2007/0189766 A1* | 8/2007 | Kuwahara et al. | 396/542 |

FOREIGN PATENT DOCUMENTS

| | | |
|---|---|---|
| JP | 63-313101 A | 12/1988 |
| JP | 2000-173947 | 6/2000 |
| JP | 2003-35855 | 2/2003 |
| JP | 3498775 | 12/2003 |
| JP | 2004-311812 | 11/2004 |
| JP | 2005-124221 A | 5/2005 |
| JP | 2005-217890 A | 8/2005 |

OTHER PUBLICATIONS

Japanese Office Action mailed by JPO and corresponding to Japanese application No. 2005-307893 on Sep. 7, 2010, with English translation.

* cited by examiner

*Primary Examiner* — David Ometz
*Assistant Examiner* — Quang Le
(74) *Attorney, Agent, or Firm* — Fujitsu Patent Center

(57) ABSTRACT

To provide an image pickup apparatus with excellent optical characteristics as well as high reliability and a method of manufacturing the same, capable of efficiently manufacturing the image pickup apparatus in large quantities. The image pickup apparatus of the present invention includes a support board 10, an image pickup device 20 mounted on the support board 10, and a lens component 30 provided on the light receiving region of the image pickup device 20, wherein the lens component 30 has a protrusion part 33 provided around the lens part 31, and the height of the protrusion part 33 from the surface of image pickup device 20 is greater than that of the top 31A of lens part 31 from the surface of the image pickup device 20.

2 Claims, 19 Drawing Sheets

IMAGE PICKUP APPARATUS AND METHOD OF MANUFACTURING THE SAME

CROSS-REFERENCE TO RELATED APPLICATIONS

This application is based upon and claims the benefits of the priority from the prior Japanese Patent Application No. 2005-307893, filed on Oct. 21, 2005, the entire contents of which are incorporated herein by reference.

BACKGROUND OF THE INVENTION

1. Field of the Invention

The present invention relates to an image pickup apparatus and a method of manufacturing the same. More specifically, the present invention relates to an image pickup apparatus with excellent optical characteristics as well as high reliability, and to a method of efficiently manufacturing the image pickup apparatus in large quantities.

2. Description of the Related Art

Electronic devices such as digital cameras and camera-mounted cellular phones have an image pickup apparatus that is equipped with, for example, an image pickup device such as a charge coupled device (CCD). Such an image pickup apparatus has been required to be reduced in size and weight; therefore, optical components such as the image pickup device and lens are housed in a plastic package.

The form in which optical components such as an image pickup device and lens are housed in a plastic package—a structure obtained by sealing them with resin—is disclosed, for example, in Japanese Patent Application Laid-Open No. 2000-173947, which shows a structure formed by arranging a glass lens, which is convex on one side, on the light receiving part of a CCD chip fixed to a lead frame and by performing molding with the convex lens protruded from the resin.

Meanwhile, Japanese Patent Application Laid-Open No. 2004-311812 discloses as another configuration of the image pickup apparatus a structure in which on an image pickup device fixed onto a wiring board an imaging lens part, similarly fixed onto the wiring board, is provided, in which a light shielding cover with an aperture and a filter are provided on the light-receiving side of the imaging lens part, and in which the circumferential surfaces of the light shielding cover and imaging lens part are covered with a resin mold.

In the image pickup apparatus disclosed in Japanese Patent Application Laid-Open No. 2000-173947, the amount (height) of the lens protruding from the resin-sealed part is set high. Thus, upon performing resin molding, for example, the shape of a mold needs to be so designed that sealing resin never comes in contact with the lens protrusion part, and the resultant image pickup apparatus needs to be handled carefully so as not to damage the lens protrusion part.

Meanwhile, in the image pickup apparatus disclosed in Japanese Patent Application Laid-Open No. 2004-311812 resin molding is performed after attaching the light shielding cover and filter onto the imaging lens part. For this reason, it is highly likely that an increase in temperature during the resin molding process undesirably reduces the bonding strength between the imaging lens part and the light shielding cover or filter, or causes mechanical damage to them.

Moreover, a mold corresponding to the shape and thickness (height) of a light shielding cover or filter needs to be prepared for resin molding, making it difficult to realize mass production of image pickup apparatuses and to reduce the manufacturing cost.

In addition, optical glasses, such as IR-cut glass, are generally used in order to improve the optical characteristics of image pickup devices. However, providing optical glass between an image pickup device and a lens will cause, for example, the following problem: air expands with heat in reflow molding, and the optical glass is pressurized by the expanded air and undesirably falls off.

Accordingly, the provision of both an image pickup apparatus with excellent optical characteristics as well as high reliability, and a method capable of efficiently manufacturing the image pickup apparatus in large quantities has been awaited.

An object of the present invention is to solve the foregoing conventional problems and to achieve the following object: an object of the present invention is to provide an image pickup apparatus which can be miniaturized, and has excellent optical characteristics as well as high reliability, and a method of manufacturing an image pickup apparatus, which is capable of efficiently manufacturing the image pickup apparatus in large quantities.

SUMMARY OF THE INVENTION

The image pickup apparatus of the present invention includes a support board, an image pickup device mounted on the support board, and a lens component provided on a light receiving region of the image pickup device, wherein the lens component has a protrusion part provided around a lens part, and the height of the protrusion part from the surface of the image pickup device is greater than the height of the top part of the lens part from the surface of the image pickup device.

Since the protrusion part that has a height greater than the height of the lens part is provided around the lens part in the image pickup apparatus, the lens part can be protected from damage due to external forces and thus it is possible to prevent the reduction in the optical characteristics of the image pickup apparatus.

Furthermore, the image pickup apparatus of the present invention includes a support board, an image pickup device mounted on the support board, and a lens component provided on a light receiving region of the image pickup device, wherein the lens component has a plurality of protrusion parts selectively provided around a lens part, the height of the protrusion parts from the surface of the image pickup device is smaller than the height of the top part of the lens part from the image pickup device, and sealing resin is provided between the protrusion parts and the lens part.

In the image pickup apparatus the sealing resin is provided around the lens part, and light is blocked by it to provide a lens aperture. Thus, it is possible to reduce the number of components and the number of assembling processes without reducing the optical characteristics of the image pickup apparatus.

The method of the present invention for manufacturing an image pickup apparatus includes mounting an image pickup device on a support board, mounting a lens component on a light receiving region of the image pickup device, and performing resin sealing in a state where a protrusion part provided around a lens part of the lens component is in contact with the inner surface of a mold.

With this manufacturing method, it is possible to prevent the sealing resin from unnecessarily reaching the lens part and thus to increase the productivity of image pickup apparatuses without making no modification to the mold.

DESCRIPTION OF THE PREFERRED EMBODIMENTS

Hereinafter, the image pickup apparatus of the present invention and the manufacturing method thereof will be described in detail in line with Examples. However, the present invention is not particularly limited to Examples described below.

Example 1

Figure 1A:
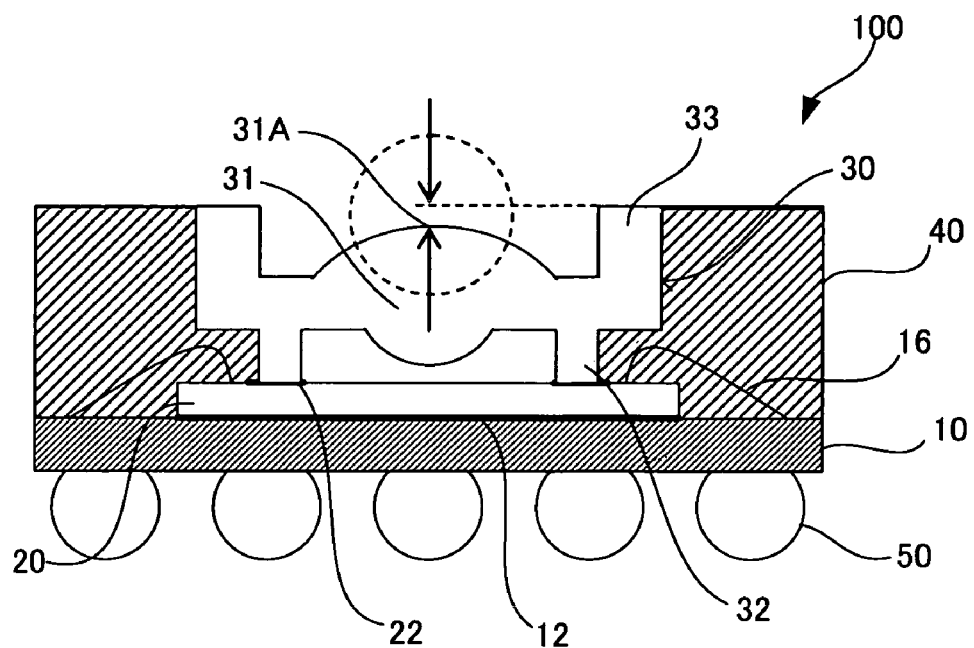
FIG. 1A is a vertical cross-sectional view taken along X-X line in FIG. 1B, showing the first Example (Example 1) of an image pickup apparatus of the present invention.
Figure 1B:
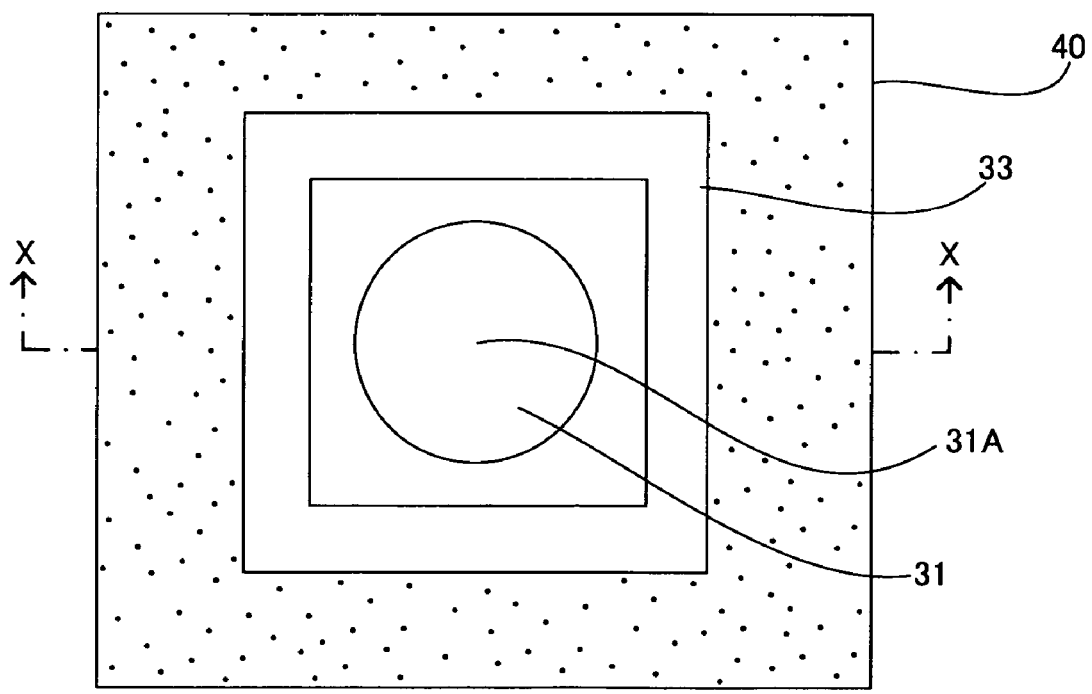
FIG. 1B is a top view showing the first Example (Example 1) of the image pickup apparatus of the present invention.

An image pickup apparatus 100 according to the first Example of the present invention is shown in FIGS. 1A and 1B. FIG. 1A is a cross-sectional view taken along X-X line in FIG. 1B.

In these drawings an image pickup device 20 is mounted on one main surface (upper surface) of a support board 10, and is fixed to it with a die bonding material 12. The electrode of the image pickup device 20 and the electrode of the support board 10 are connected together with wires 16.

A lens component 30 made of synthetic quartz glass is mounted on the image pickup device 20, and is fixed to it with an adhesive 22.

The circumferential surface of the lens component 30, the exposed surface of the image pickup device 20, and the surface of the support board 10 around the image pickup device 20 are all sealed with sealing resin 40, encapsulating the wires 16.

Meanwhile, a plurality of external connection terminals 50 is provided on the other main surface (lower surface) of the support board 10.

In this configuration the support board 10 is formed of an insulating layer, which is a support, and is provided with a wiring layer (or a multilayered wiring layer on an as-needed basis) on one or both sides, where one of the main surfaces thereof is provided with unillustrated electrode pads to be connected to the electrode of the image pickup device 20 and the other main surface with unillustrated electrode pads on which external connection terminals are to be formed.

In addition, the image pickup device 20 is a CCD or MOS type image pickup device, and is formed through a well-known semiconductor manufacturing process.

A plurality of unillustrated picture elements (pixels) is formed on the light receiving region of the image pickup device 20, and color filters and microlens are placed thereon for each of the picture elements.

Furthermore, the lens component 30 has a lens part 31 (a biconvex lens in the shown Example) corresponding to the light receiving region of the image pickup device 20, and a lens barrel part 32 (lens barrel-shaped support) which extends in one direction of the optical axis of the lens part 31 to support the lens part 31 and which has a length that allows the lens part 31 to be located at the appropriate position relative to the light receiving region (i.e., at the appropriate distance (or height) from the light receiving region) when placed on the light receiving region of the image pickup device 20.

Furthermore, in this Example, a protrusion part 33 is provided around the lens part 31, the protrusion part 33 extending in the other direction of the optical axis of the lens part 31 and having a height (distance) from the surface of the image pickup device 20, which is greater than the height of the top 31A of the lens part 31 formed of a convex lens.

The lens barrel part 32 and protrusion part 33 are made of the same material as the lens part 31, e.g., synthetic quartz glass, and are formed together with the lens part 31; in this Example their planar shape (the shape on a planar surface which is in parallel with the surface of the image pickup device 20) is a rectangular frame. The lens barrel part 32 is of such a dimension as to surround at least the light receiving region of the image pickup device 20, whereas the protrusion part 33 is of such an aperture dimension as to surround at least the light receiving part formed of the convex lens.

The circumferential surface of the lens component 30, the exposed surface of the image pickup device 20, and the surface of the support board 10 around the image pickup device 20 are all sealed with the sealing resin 40, encapsulating the wires 16.

Moreover, the external connection terminals 50 made of a solder ball are provided on the other main surface of the support board 10.

In this image pickup apparatus 100 the protrusion part 33 has a height greater than the height of the top point (the top 31A) of the light receiving surface of the lens part 31 in the lens component 30. Thus, it is possible to prevent the lens part 31 from coming in contact with external components.

Figure 2A:
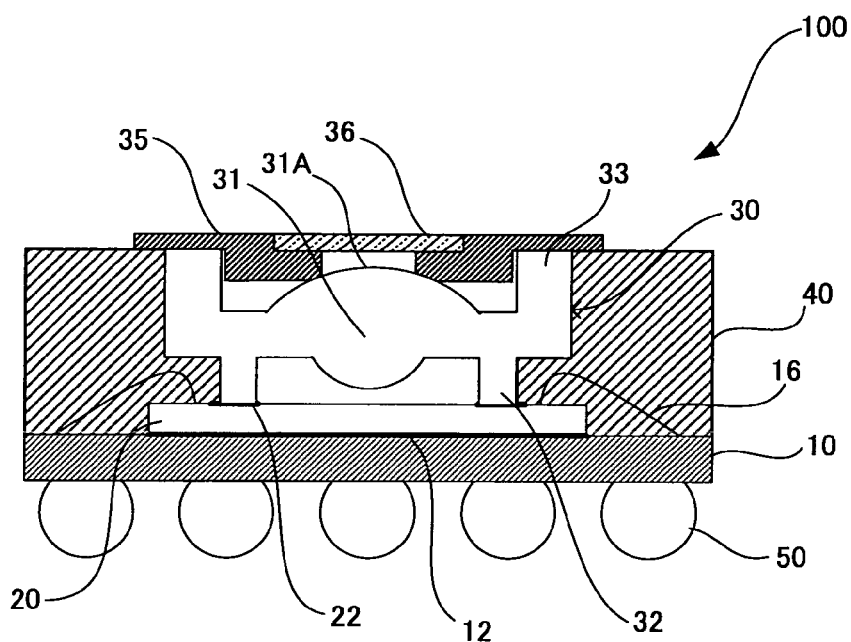
FIG. 2A is a vertical cross-sectional view taken along X-X line in FIG. 2B, showing a modification of the first Example (Example 1) of the image pickup apparatus of the present invention.
Figure 2B:
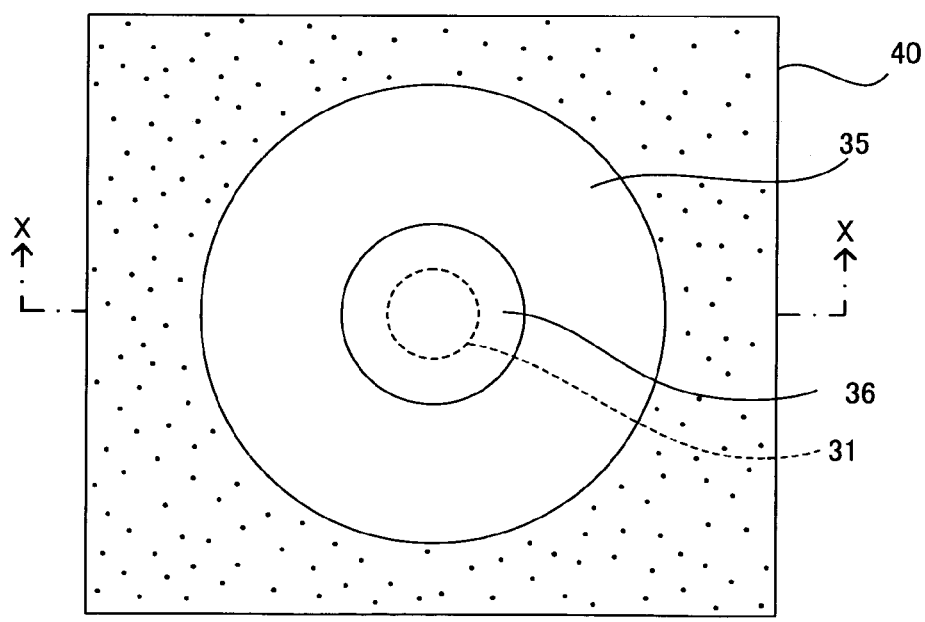
FIG. 2B is a top view showing the modification of the first Example (Example 1) of the image pickup apparatus of the present invention.

When the image pickup apparatus 100 in this Example is used, that is, mounted on electronic devices, a light shielding plate for diaphragm 35 and an infrared ray (IR) filter 36 are provided on the light receiving side of the lens part 31 as shown in FIGS. 2A and 2B.

At this point, the light shielding plate for diaphragm 35 is received by and positioned in the protrusion part 33, and is fixed to it with an unillustrated adhesive. The infrared ray (IR) filter 36 is received by and retained in the concave part provided in the light shielding plate for diaphragm 35.

In the image pickup apparatus 100 of this Example and in other Examples described later, the insulating material constituting the support board 10 can be selected from resins such as polyesters, polyimides, bismaleimide triazine, thermosetting polyphenylene ethers and fluorine resins, ceramic boards, copper clad laminates, and resin coated copper (RCC) foil boards in addition to glass epoxy resin, depending on the conditions under which they are manufactured and used.

For the image pickup device 20, a CCD or MOS type image pickup device is appropriately selected depending on how it is used and on conditions under which it is used, as described above.

Meanwhile, the lens component 30 is made of synthetic quartz glass as described above, or made of plastic material such as polycarbonate and PMMA (methacrylic resin). The lens configuration is not limited to a convex lens; it may adopt a concave lens, and an aspheric lens or the like may be selected depending on the optical characteristics required.

The lens barrel part 32 and protrusion part 33 in the lens component 30 are formed together with the lens part 31. In this way it is made possible to simplify the manufacturing process and reduce the manufacturing cost, as well as to further miniaturize image pickup apparatuses and improve their mechanical strength.

It is, of course, possible to separately form the lens part 31, lens barrel part 32 and/or protrusion part 33 beforehand and then assemble them together. However, this method is not sufficient in terms of simplicity of the manufacturing process, reduction in the manufacturing cost, miniaturization of image pickup apparatuses, or their mechanical strength.

In addition, the planar shape of the lens barrel part 32 and protrusion part 33 (the shape on a planar surface which is in parallel with the surface of the image pickup device 20) is not limited to a rectangular frame; a circular frame, an oval frame, a polygonal frame or the like can also be adopted.

Specifically, the frame shape of the lens barrel part 32 is selected depending on, for example, the shape of the light receiving region of the image pickup device, and the shape of the protrusion part 33 and the distance between the protrusion part 33 and the lens part 31 are selected depending on how the film or light shielding plate for diaphragm is arranged, as well as on how the protrusion part 33 is sealed with resin.

In addition, epoxy resin adhesives or acrylic resin adhesives can be adopted for the adhesive 22.

For the sealing resin 40, epoxy resins that are generally used as outer packaging for semiconductor devices are used. For the resin sealing method, transfer molding or compression molding can be adopted.

The form of the external connection terminals 50 is not limited to Ball Grid Array (BGA) using the solder ball, other forms can also be adopted, such as Land Grid Array (LGA).

Furthermore, the light shielding plate for diaphragm 35 may be formed of a plate or film, which is made of metal or material with no optical transparency, such as color resin or colored resin. The infrared ray (IR) filter 36 may be made of optical glass such as IR-cut glass.

Note that although not adopted in Examples of the present invention, optical glass constituting a lowpass filter for preventing the generation of Moire fringes may be adopted as needed in some cases.

As shown in other Examples described below, the various arrangements can be selected for the light shielding plate for diaphragm 35 and infrared ray (IR) filter 36, depending on the form of the lens component 30.

An example of a method of manufacturing the image pickup apparatus 100 according to the first Example of the present invention shown in FIGS. 1A, 1B, 2A and 2B will be described with reference to the drawings.

Figure 3:
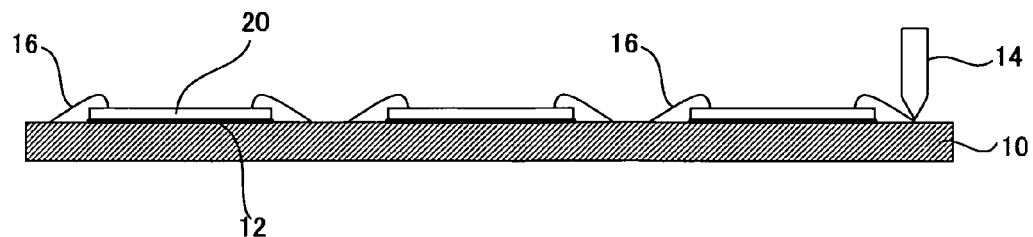
FIG. 3 is a cross-sectional view of process (No. 1) for explaining a process in an example of a method of manufacturing the image pickup apparatus of the present invention (Example 1).

As shown in FIG. 3, the image pickup device 20 is first fixed onto one main surface of the support board 10 by use of the die bonding material 12. Wire bonding is then performed using a bonding capillary 14 to connect the electrode pads of the image pickup device 20 to the electrode of the support board 10 by use of the wires 16.

As described above, the image pickup device 20 is a CCD or MOS type image pickup device, and is formed through a well-known semiconductor manufacturing process. The support board 10 is formed of, for example, glass epoxy resin, which is a support, and is provided with a wiring layer (or a multilayered wiring layer) on one or both sides, and unillustrated lands (electrode pads) are provided on the both sides. For the wires 16, gold (Au) wires can be adopted, for example.

Here, for the purpose of forming a plurality of image pickup apparatuses at a time, a large support board is used for the support board 10, on which wires, lands and the like are previously formed in numbers enough to form a plurality of image pickup devices.

Figure 4:
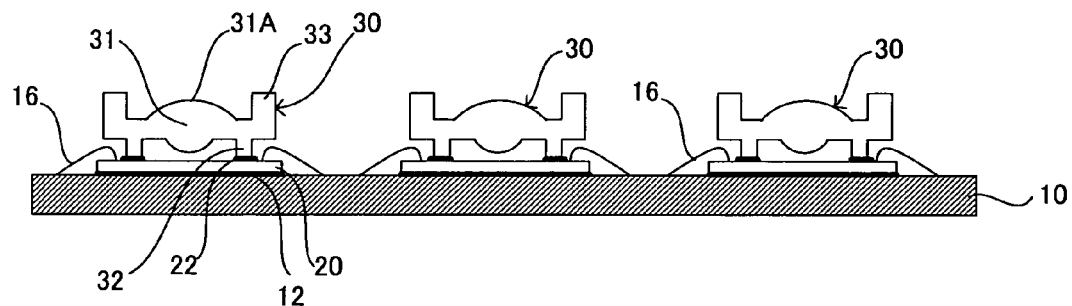
FIG. 4 is a process cross-sectional view (No. 2) for explaining a process in the example of the method of manufacturing the image pickup apparatus of the present invention (Example 1).

Next, as shown in FIG. 4, the lens component 30 is fixed onto the main surface (the surface on which the light receiving region is formed) of the image pickup device 20 by use of the adhesive 22.

Here, the lens component 30 is made of synthetic quartz glass and, as described above, has the lens part 31 (convex lens), the lens barrel part 32 which supports the lens part 31 and positions it at the appropriate position relative to the light receiving region, and the protrusion part 33 which is positioned across the lens part 31 from the image pickup device 20 and which has a height greater than the top 31A of the light receiving part formed of the convex lens.

The lens barrel part 32 is fixed onto the image pickup device 20 in such a way that it surrounds the light receiving region of the image pickup device 20 and that the incoming light passing through the lens part 31 can reach the light receiving region more efficiently.

Figure 5:
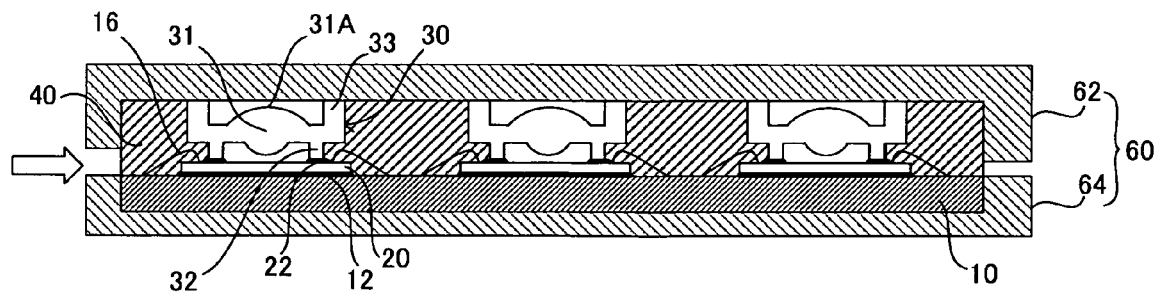
FIG. 5 is a process cross-sectional view (No. 3) for explaining a process in the example of the method of manufacturing the image pickup apparatus of the present invention (Example 1).

Next, the support board 10 is attached to a mold 60, and a molding process is carried out by injecting sealing resin in the mold 60 (in the direction indicated by the arrow in FIG. 5) from an unillustrated resin pod connected to it. By this molding process, the main surfaces of the support board 10, the lens component 30, and the image pickup device 20 are all sealed with the sealing resin. The state of the support board 10 after sealed with the resin in the mold 60 is shown in FIG. 5.

Here, the mold 60 has upper and lower molds 62 and 64. They are attached to the support board 10, with the top surface of the tip part of the protrusion part 33 of the lens component 30 brought in contact with the inner surface of the upper mold 62 and with the second main surface (back surface) of the support board 10 brought in contact with the inner surface of the lower mold 64. In this state the sealing resin 40 is injected in the mold 60 by transfer molding.

Since the protrusion part 33 has a rectangular shape and is in contact with the inner surface of the upper mold 62 at this point, it is possible to prevent the sealing resin 40 from reaching the lens part 31 of the lens component 30. In addition, the lens part 31 never comes in contact with the inner surface of the upper mold 62.

Furthermore, the sealing resin 40 never reaches the light receiving region of the image pickup device 20 because of the presence of the lens barrel part 32 of the lens component 30.

Figure 6:
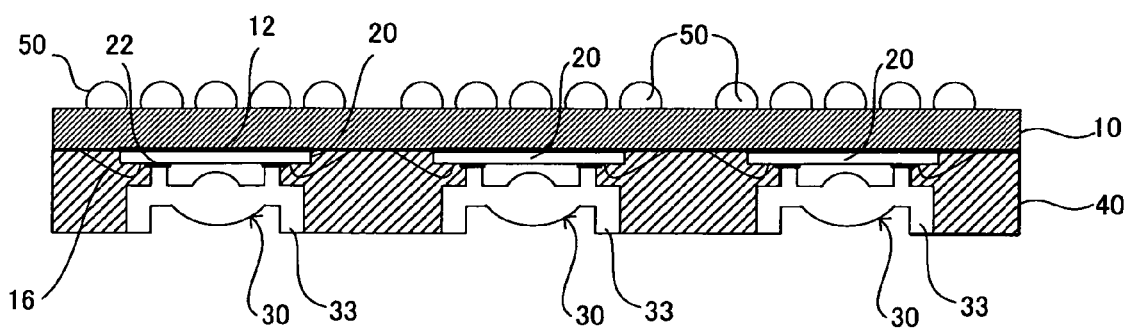
FIG. 6 is a process cross-sectional view (No. 4) for explaining a process in the example of the method of manufacturing the image pickup apparatus of the present invention (Example 1).

After the sealing resin 40 is cured, the support board 10 is taken out of the mold 60, and the external connection terminal 50 made of a solder ball is formed for each of the plurality of lands formed on the other main surface of the support board 10, as shown in FIG. 6.

Figure 7:
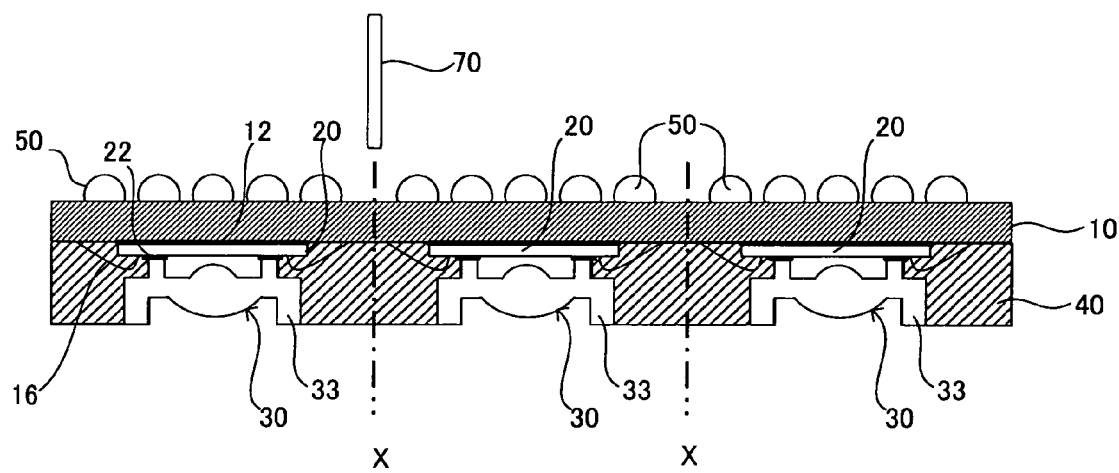
FIG. 7 is a process cross-sectional view (No. 5) for explaining a process in the example of the method of manufacturing the image pickup apparatus of the present invention (Example 1).

Using a dicing blade 70, the support board 10 and sealing resin 40 are then cut along dicing lines X into a plurality of distinct image pickup apparatuses 100 (package dicing), as shown in FIG. 7.

Subsequently, the light shielding plate for diaphragm 35 and infrared ray (IR) filter 36 are attached to the protrusion part 33 of the lens component 30. In this way the image pickup structure shown in FIGS. 2A and 2B can be obtained.

As shown in Examples described below, various modifications can be made to the image pickup apparatus of the present invention obtained as described above.

Example 2

Figure 8A:
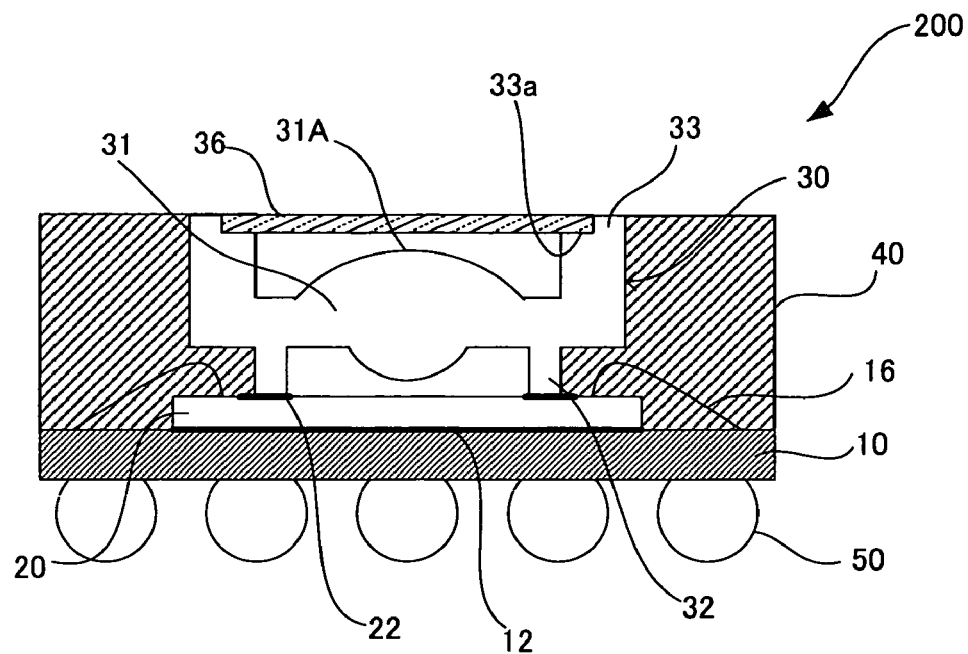
FIG. 8A is a vertical cross-sectional view showing another embodiment (Example 2) of the image pickup apparatus of the present invention.
Figure 8B:
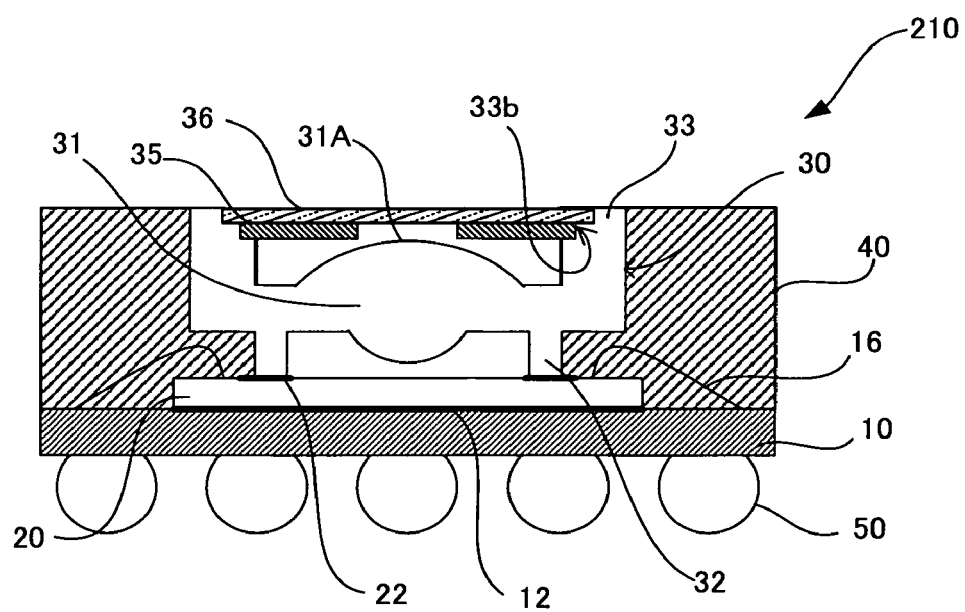
FIG. 8B is a vertical cross-sectional view showing a modification of Example 2 of the image pickup apparatus of the present invention.

The second Example of the image pickup apparatus of the present invention is shown in FIGS. 8A and 8B.

These drawings show a cross-sectional view of an image pickup apparatus taken along X-X line, as does FIG. 1A.

As shown in FIG. 8A, an image pickup apparatus 200 is provided with a step part 33a inside the protrusion part 33 of the lens component 30, and the infrared ray (IR) filter 36 is attached to and retained by the step part 33a.

Moreover, an image pickup apparatus 210 shown in FIG. 8B is provided with a two-stage step part 33b, whereby the infrared ray (IR) filter 36 and light shielding plate for diaphragm 35 overlap one another in the optical axis direction, so that they are retained in the step part 33b.

The step part 33b includes a step part located on the image pickup 20 side, and a step part having a larger opening than that step part. The light shielding plate for diaphragm 35 and infrared ray (IR) filter 36 are attached to and retained by the lower and upper step parts, respectively.

In the image pickup apparatuses 200 and 210, the light shielding plate for diaphragm 35 and infrared ray (IR) filter 36 which are retained by the protrusion part 33 are also positioned higher than the top 31A of the lens part 31, thereby facilitating the formation of the sealing resin part 40 and enabling the protection of the lens part 31 against damage.

Example 3

Figure 9A:
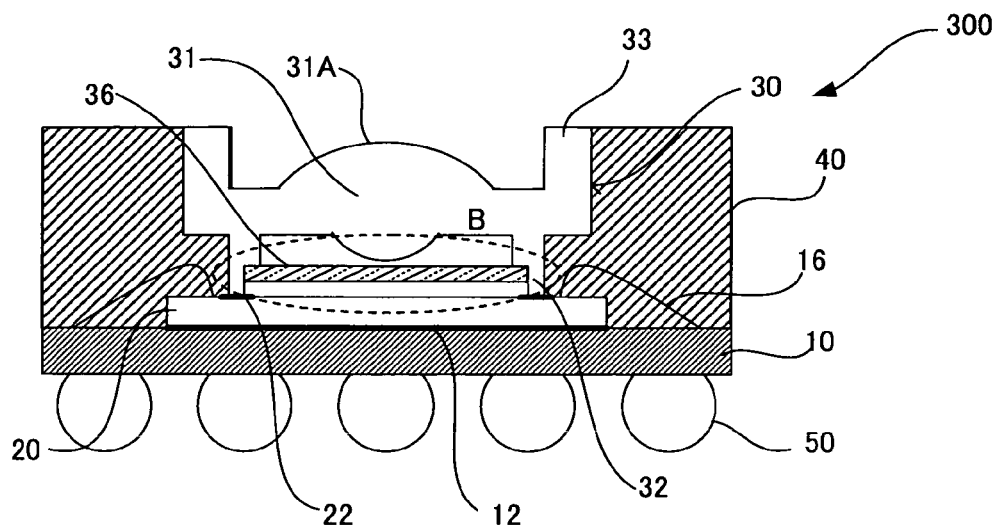
FIG. 9A is a vertical cross-sectional view showing another embodiment (Example 3) of the image pickup apparatus of the present invention.
Figure 9B:
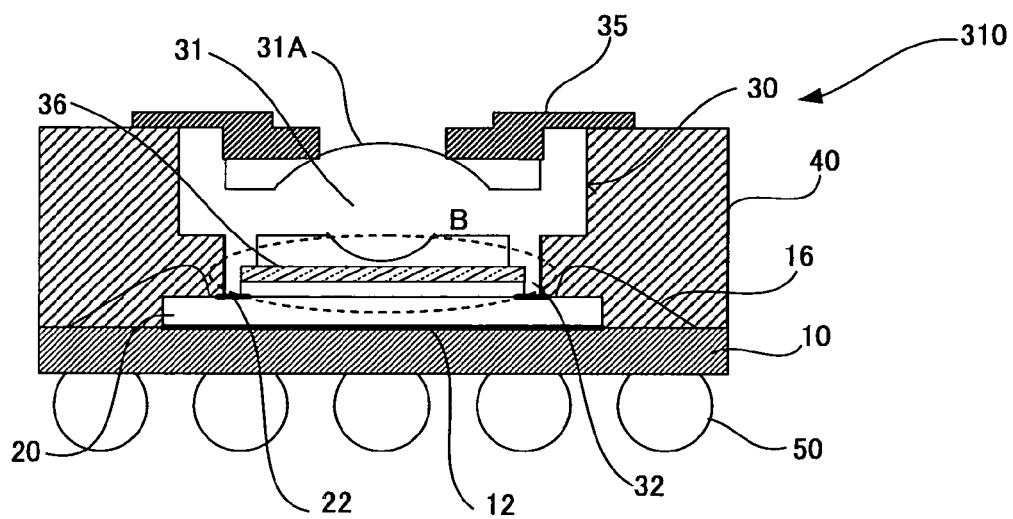
FIG. 9B is a vertical cross-sectional view showing a modification of Example 3 of the image pickup apparatus of the present invention.

The third Example of the image pickup apparatus of the present invention is shown in FIGS. 9A and 9B.

These drawings show a cross-sectional view of an image pickup apparatus taken along X-X line, as does FIG. 1A.

In both an image pickup apparatus 300 shown in FIG. 9A and an image pickup apparatus 310 shown in FIG. 9B, the infrared ray (IR) filter 36 is provided in a space (gap) created between the image pickup device 20 and the lens part 31 of the lens component 30. To be more specific, the infrared ray (IR) filter 36 is positioned closer to the image pickup device 20 compared to Examples described above.

As in the case of Example 1, the light shielding plate for diaphragm 35 is received and retained by the protrusion part 33 in the image pickup apparatus 310.

Figure 9C:
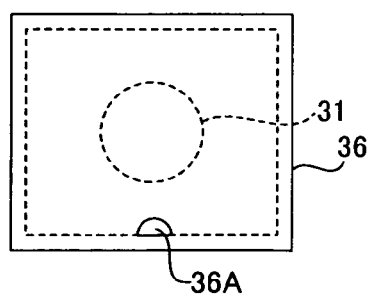
FIG. 9C is a plan view showing the principal portion of Example 3 of the image pickup apparatus of the present invention.

The plan view of the infrared ray (IR) filter 36, viewed from the image pickup device 20, of the image pickup apparatuses 300 and 310 is shown in FIG. 9C. This drawing corresponds to the portion B which is surrounded by the broken line in FIGS. 9A and 9B.

As shown in FIG. 9C, an air hole 36A is provided in the infrared ray (IR) filter 36 of this Example, avoiding the lens part 31. Thus, air can flow in and out through the air hole 36A without reducing the optical characteristics of the lens part 31.

Specifically, in the image pickup apparatuses 300 and 310, air present in the gap between the image pickup device 20 and the lens part 31 can flow in or out through the air hole 36A.

Accordingly, even when the image pickup apparatuses 300 and 310 that are under manufacture are placed in a high temperature environment (e.g., 230° C. or above), such as resin molding process and/or reflow of electronic components and thus air expansion has occurred in the gap, there is no likelihood that pressure by the expanded air is applied to the infrared ray (IR) filter 36. For this reason, the infrared ray (IR) filter 36 never falls off the lens component 30 or be damaged.

Example 4

Figure 10A:
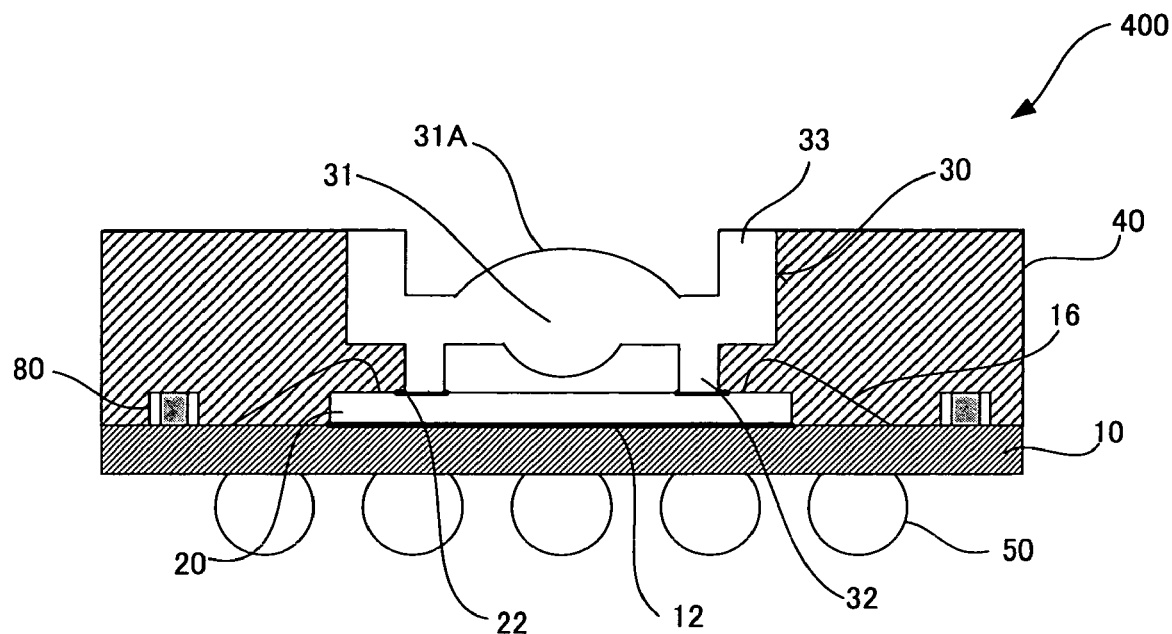
FIG. 10A is a vertical cross-sectional view showing another embodiment (Example 4) of the image pickup apparatus of the present invention.
Figure 10B:
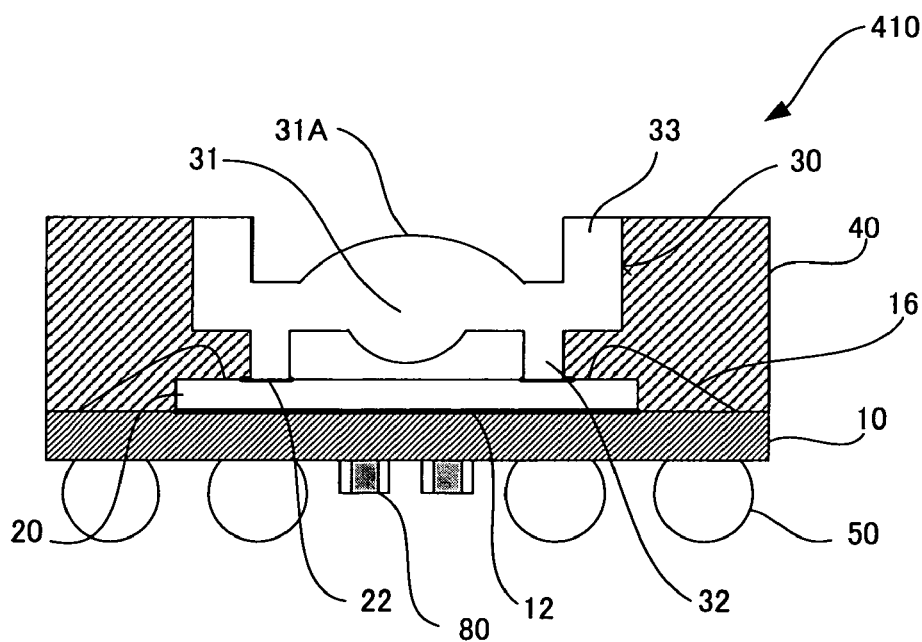
FIG. 10B is a vertical cross-sectional view showing a modification of Example 4 of the image pickup apparatus of the present invention.
Figure 10C:
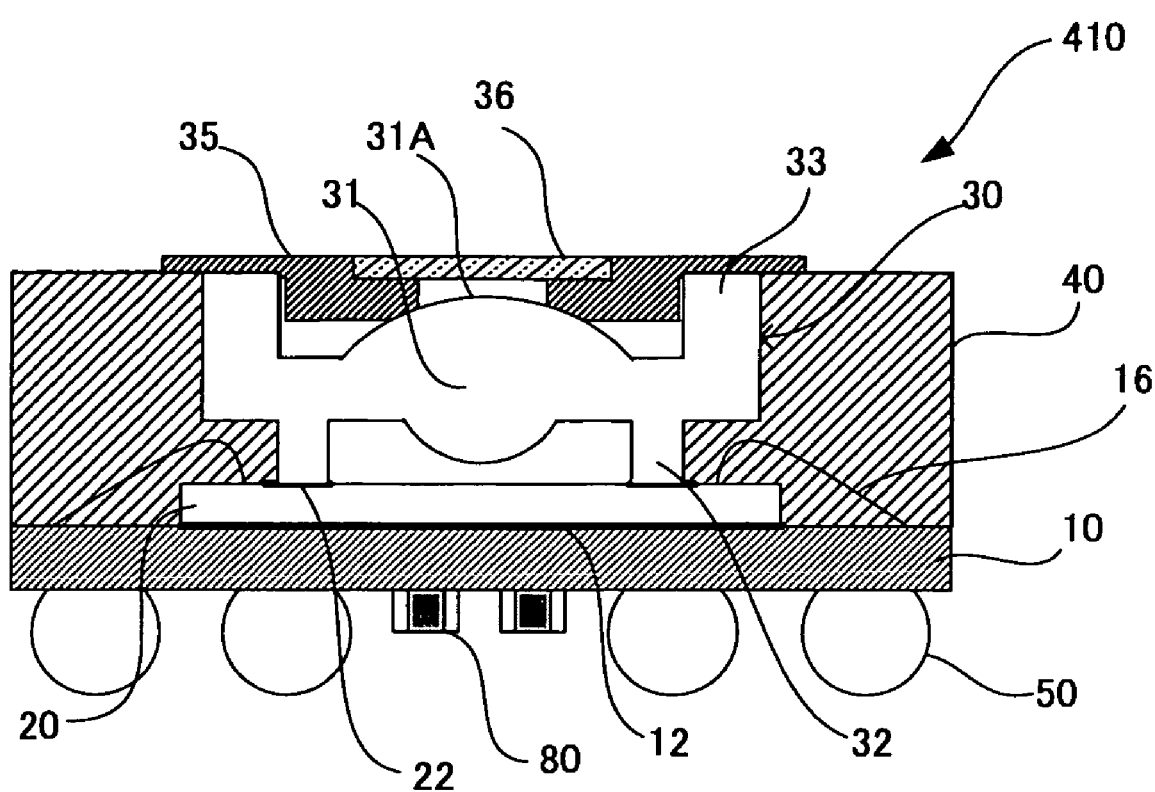
FIG. 10C is a vertical cross-sectional view showing still another modification of Example 4 of the image pickup apparatus of the present invention.

The fourth Example of the image pickup apparatus of the present invention is shown in FIGS. 10A to 10C.

These drawings show a cross-sectional view of an image pickup apparatus taken along X-X line, as does FIG. 1A.

In an image pickup apparatus 400 shown in FIG. 10A and an image pickup apparatus 410 shown FIG. 10B, electronic components 80 such as capacitors or semiconductor devices are mounted on and fixed to one main surface (upper surface) or the other main surface (lower surface) of the support board 10.

In the image pickup apparatus 400 shown in FIG. 10A, two electronic components 80 are mounted on and fixed to the support board 10.

Moreover, in the image pickup apparatus 410 shown in FIG. 10B, two electronic components 80 are mounted on and fixed to the back surface of the support board 10 at a position right below the image pickup device 20.

As described above, by mounting the electronic components 80 other than the image pickup device 20 on the front or back surface of the support board 10 at a position closer to the image pickup device 20, the length of wires for connecting the image pickup device 20 to the electronic components 80 can be reduced. It is therefore possible to achieve miniaturization of image pickup apparatuses and to improve their characteristics.

In the image pickup apparatus 410 shown in FIG. 10B, the light shielding plate for diaphragm 35 and infrared ray (IR) filter 36 can adopt similar arrangements as those shown in Example 1 (see FIGS. 2A and 2B). Their arrangements are shown in FIG. 10C.

Example 5

Figure 11:
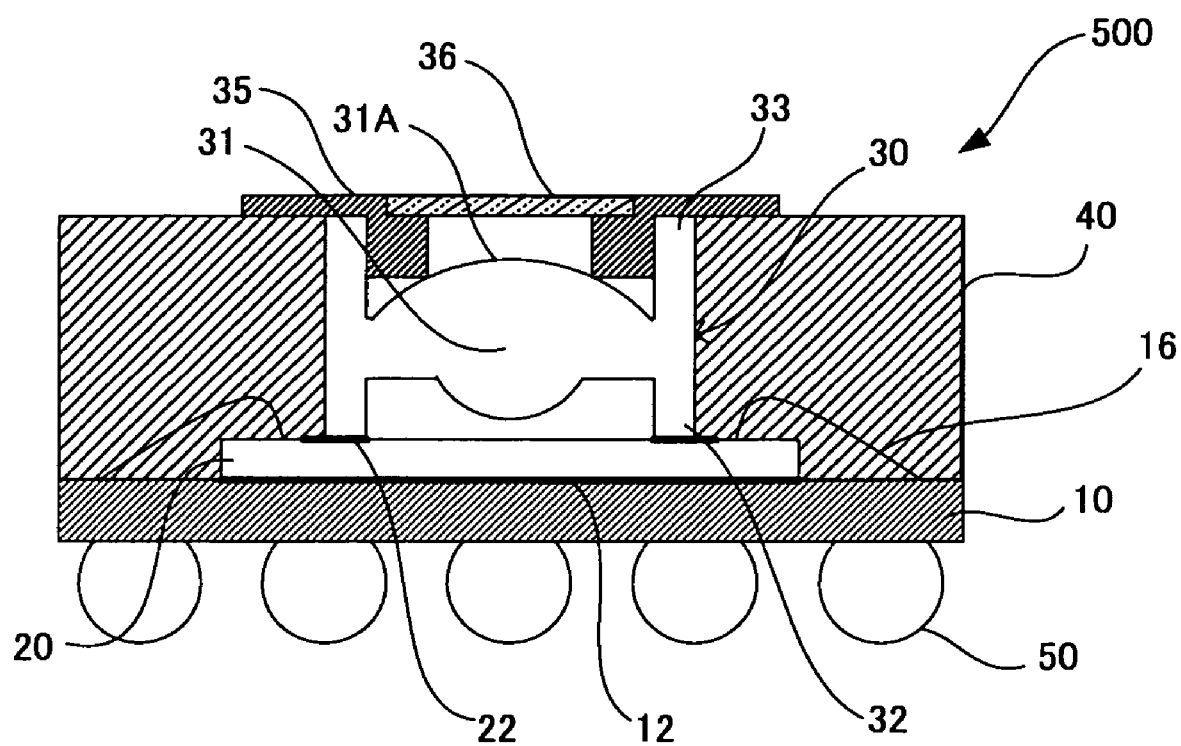
FIG. 11 is a vertical cross-sectional view showing another embodiment (Example 5) of the image pickup apparatus of the present invention.

The fifth Example of the image pickup apparatus of the present invention is shown in FIG. 11.

FIG. 11 shows a cross-sectional view of an image pickup apparatus taken along X-X line, as does FIG. 1A.

The structural feature of an image pickup apparatus 500 shown in FIG. 11 is that the protrusion part 33 of the lens component 30 has the same outer dimension as that of the lens barrel part 32. Specifically, the outer dimension of the lens component 30 is smaller than that of the image pickup device 20.

With this configuration, a part of the lens component 30 never overhangs the electrode pads of the image pickup device 20 even when the lens component 30 is mounted on and fixed to the image pickup device 20.

For this reason, in the manufacturing process for the image pickup apparatus 500, the electrode pads of the image pickup device 20 and the electrode of the support board 10 can be readily connected together by wire bonding after mounting the lens component 30 on the image pickup device 20.

By providing the lens component 30 on the light receiving region of the image pickup device 20 in the earlier stage of the manufacturing process, it is possible to prevent the attachment of foreign materials to the light receiving region of the image pickup device 20 and thus to increase the production yield of image pickup apparatuses.

Note that the light shielding plate for diaphragm 35 and infrared ray (IR) filter 36 can adopt similar arrangements as those shown in Example 1 (see FIGS. 2A and 2B).

Example 6

Figure 12A:
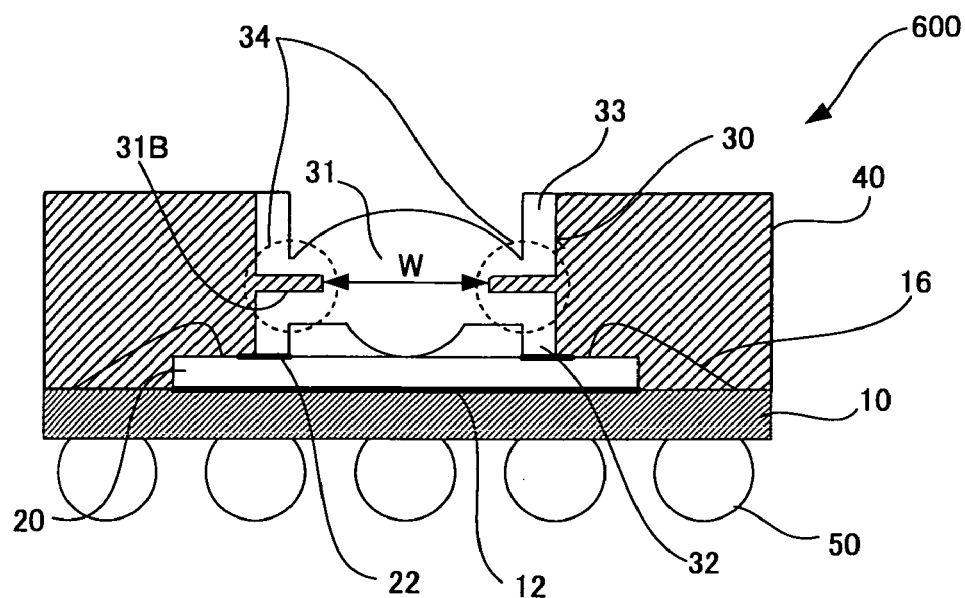
FIG. 12A is a vertical cross-sectional view showing another embodiment (Example 6) of the image pickup apparatus of the present invention.
Figure 12B:
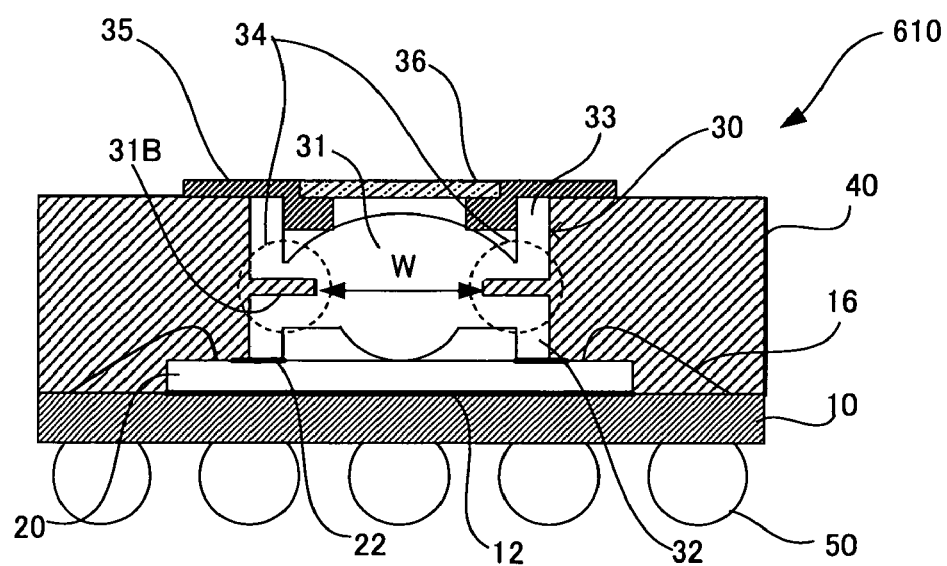
FIG. 12B is a vertical cross-sectional view showing a modification of Example 6 of the image pickup apparatus of the present invention.

The sixth Example of the image pickup apparatus of the present invention is shown in FIGS. 12A and 12B.

These drawings show a cross-sectional view of an image pickup apparatus taken along X-X line, as does FIG. 1A.

The structural feature of both an image pickup apparatus 600 shown in FIG. 12A and an image pickup apparatus 610 shown in FIG. 12B is that a diaphragm (slit) 34 is provided to the lens part 31 of the lens component 30.

To be more specific, the lens part 31 of lens component 30 in the image pickup apparatuses 600 and 610 is provided with a slit 34 which extends in the direction orthogonal to the thickness direction (the optical axis direction) of the lens part 31.

The slit 34 is provided along the entire circumferential surface of the lens component 30. Upon resin sealing, the slit 34 is filled with the sealing resin 40, and thereby part of light (incident light) passing through the lens part 31 is prevented from reaching the image pickup device 20. Specifically, the presence of the slit 34 and the resin filled it essentially reduces the width (diameter) W of a path through which light passes in the lens part 31, resulting in the formation of an "intermediate diaphragm" in the lens part 31.

In addition, since the sealing resin 40 enters the slit 34 during the molding process for the sealing resin, the resin-sealed part has an anchor effect, and it is possible to perform more robust resin sealing for the image pickup device 20, the lens component 30 and the like. Thus, it is possible to increase reliability of image pickup apparatuses.

Note that although the configuration shown in Example 5 is adopted for the lens component 30 in this Example, the slit 34 can, of course, also be formed for a lens component having the configuration shown in Example 1.

Furthermore, the light shielding plate for diaphragm 35 and infrared ray (IR) filter 36 in the image pickup apparatus 610 shown in FIG. 12B can adopt similar arrangements as those shown in Example 1 (see FIGS. 2A and 2B); two diaphragms are provided in this configuration.

Example 7

Figure 13A:
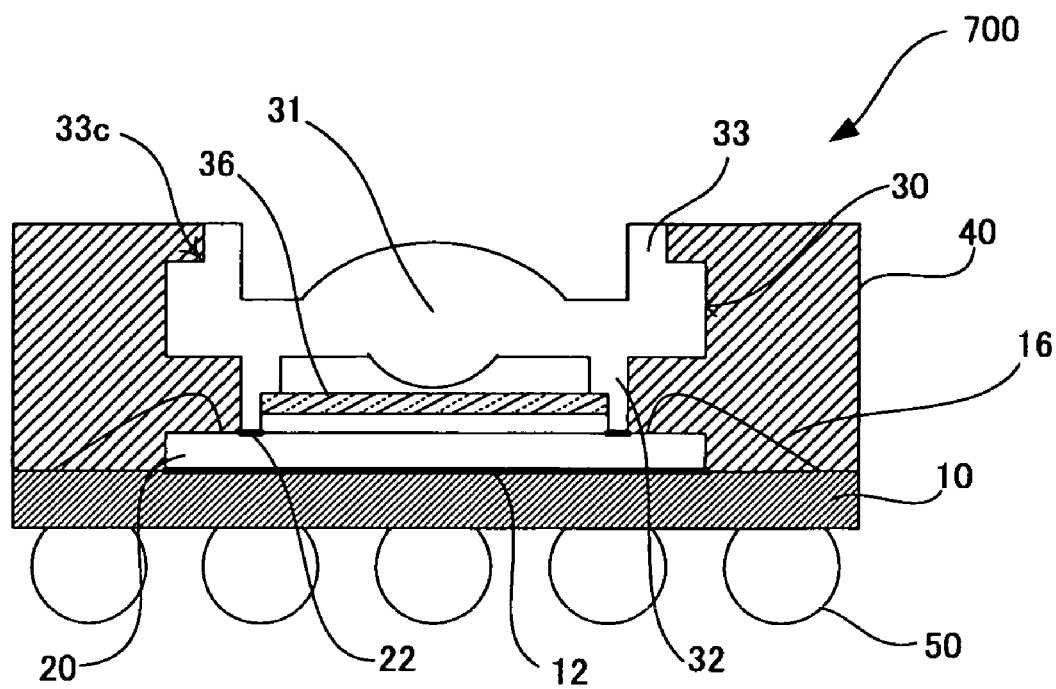
FIG. 13A is a vertical cross-sectional view showing another embodiment (Example 7) of the image pickup apparatus of the present invention.
Figure 13B:
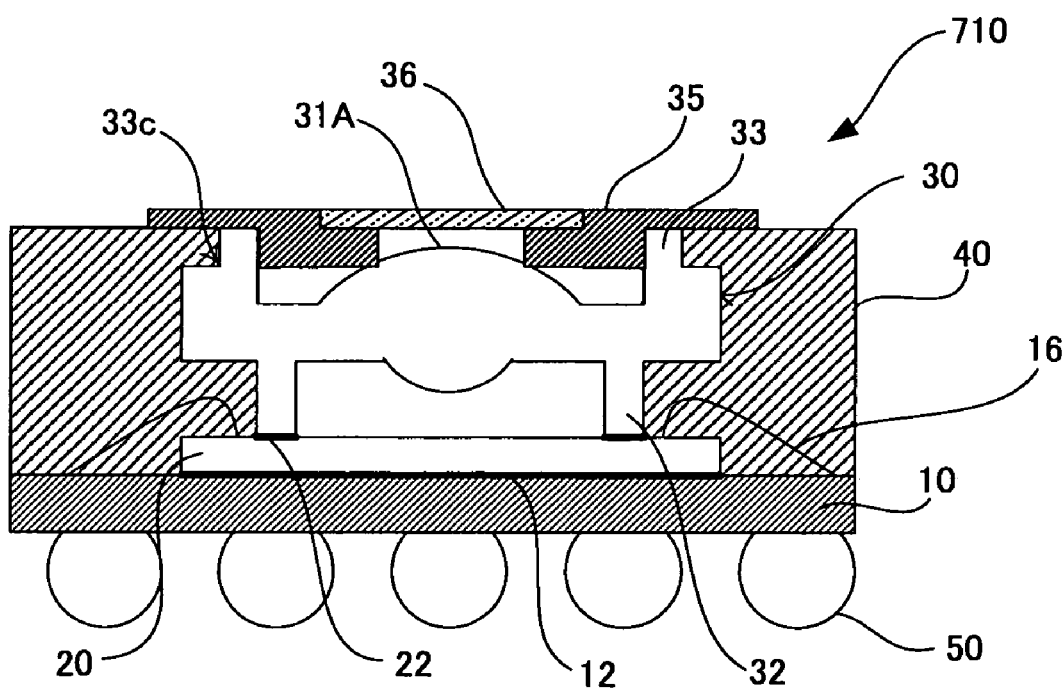
FIG. 13B is a vertical cross-sectional view showing a modification of Example 7 of the image pickup apparatus of the present invention.

The seventh Example of the image pickup apparatus of the present invention is shown in FIGS. 13A and 13B.

These drawings show a cross-sectional view of an image pickup apparatus taken along X-X line, as does FIG. 1A.

The feature of both an image pickup apparatus 700 shown in FIG. 13A and an image pickup apparatus 710 shown in FIG. 13B is that a step part 33c is provided to the periphery of the top of the protrusion part 33 of the lens component 30.

The provision of the step part 33c essentially increases the exposed area of the circumferential surface of the lens component 30, and thus the area with which the sealing resin 40 comes into contact is increased. It is therefore possible to perform more robust resin sealing for the image pickup device 20, the lens component 30 and the like, and to increase reliability of image pickup apparatuses.

Note that although the configuration shown in Example 1 is adopted for the lens component 30 in this Example, the step part 33c can, of course, also be formed for a lens component having the configuration shown in Example 5.

In addition, the step part 33c may not be continuously provided along the entire circumferential surface of the protrusion part 33, but be provided with spaces on an as-needed basis.

Furthermore, a slit (not shown) may be provided along the circumferential surface of the protrusion part 33 of the lens component 30 separately from the step part 33c in order to further increase the area with which sealing resin can come in contact.

Note that the light shielding plate for diaphragm 35 and infrared ray (IR) filter 36 in the image pickup apparatus 710 shown in FIG. 13B can adopt similar arrangements as those shown in Example 1 (see FIGS. 2A and 2B).

Example 8

Figure 14A:
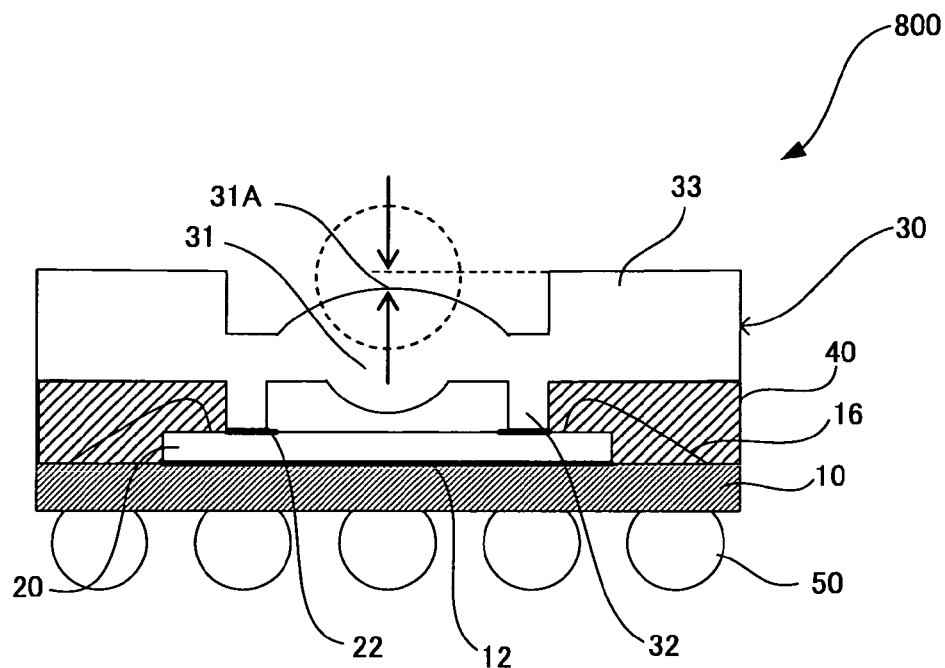
FIG. 14A is a vertical cross-sectional view showing another embodiment (Example 8) of the image pickup apparatus of the present invention.
Figure 14B:
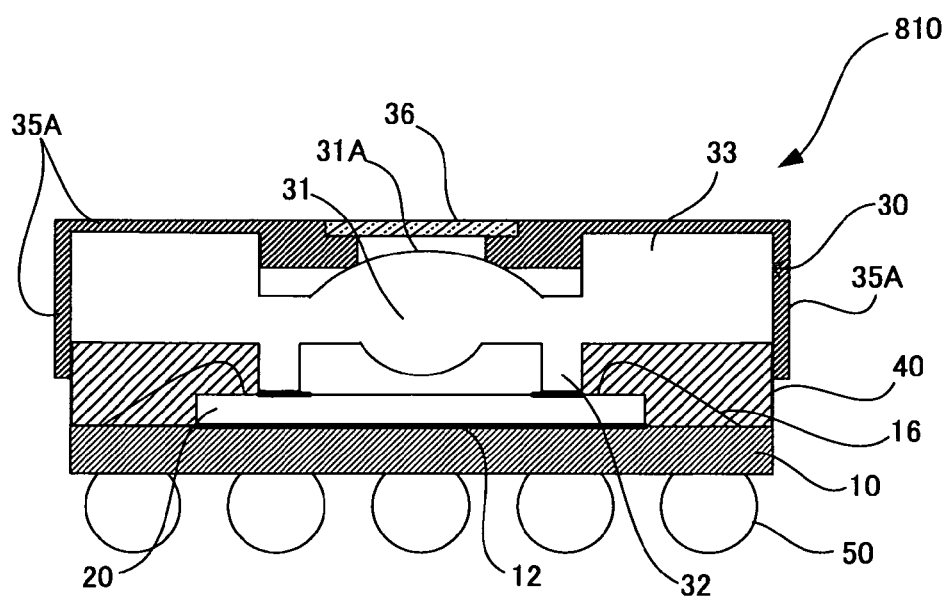
FIG. 14B is a vertical cross-sectional view showing a modification of Example 8 of the image pickup apparatus of the present invention.

The eighth Example of the image pickup apparatus of the present invention is shown in FIGS. 14A and 14B.

These drawings show a cross-sectional view of an image pickup apparatus taken along X-X line, as does FIG. 1A.

The structural feature of an image pickup apparatus 800 shown in FIG. 14A is that the planar outline and outer dimension of the protrusion part 33 of the lens component 30 are substantially the same as those of the support board 10.

Since the planar outline and outer dimension of the protrusion part 33 of the lens component 30 are substantially the same as those of the support board 10, the lens part 31 of the lens component 30 never comes in contact with the upper mold 42 during the molding process, and thus is protected against damage. In addition, during the use of the image pickup apparatus 800 the lens part 31 is protected against damage caused as a result of contact with external objects.

As described above, in an image pickup apparatus having the protrusion part 33 with a relatively large exposed area, light is sometimes introduced in the image pickup device 20 through the protrusion part 33 if the protrusion part 33 is made of the same material as the lens part 31. Such light will be a noise for the incident light from the lens part 31.

For this reason, when the light shielding plate for diaphragm 35 and infrared ray (IR) filter 36 are to be provided to the image pickup apparatus 800, a light shielding film 35A is provided to the image pickup apparatus 800 in such a way as to cover the exposed surface (upper and outer side surfaces) of the protrusion part 33, as in the case of the image pickup apparatus 810 shown in FIG. 14B.

The provision of the light shielding film 35A prevents entry of light into the protrusion part 33 from the outside.

As described above, the image pickup apparatus of the present invention can reduce the manufacturing cost and can achieve miniaturization while protecting the exposed surface of the lens part 31.

In Examples 1 to 8 the protrusion part 33, which has a height greater than the height of the lens part 31, is provided to the lens component 30, and thereby the lens part 31 is protected against external mechanical forces from the outside. The present invention is not, however, limited to this configuration and can adopt forms as described below.

Hereinafter, the structures of other image pickup apparatuses of the present invention and the manufacturing method thereof will be described in detail in line with Examples.

Example 9

Figure 15A:
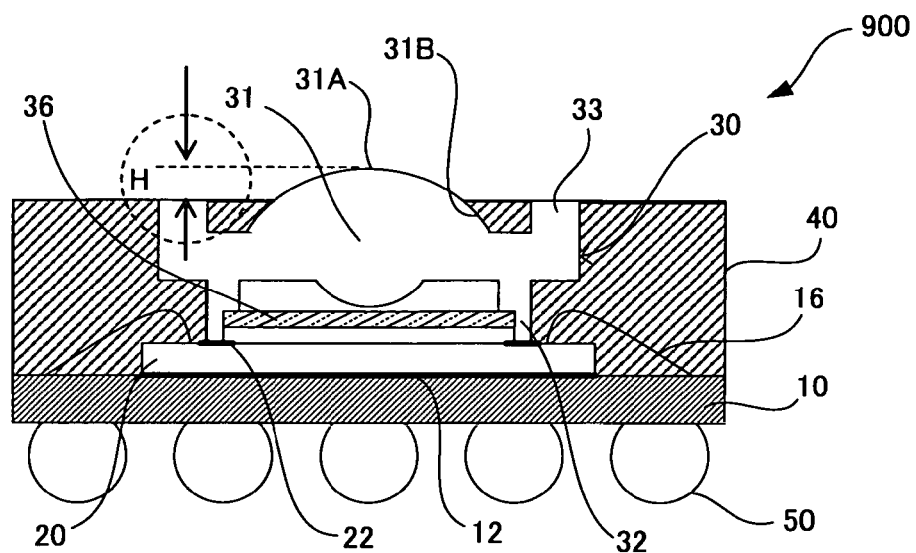
FIG. 15A is a vertical cross-sectional view showing another embodiment (Example 9) of the image pickup apparatus of the present invention.
Figure 15B:
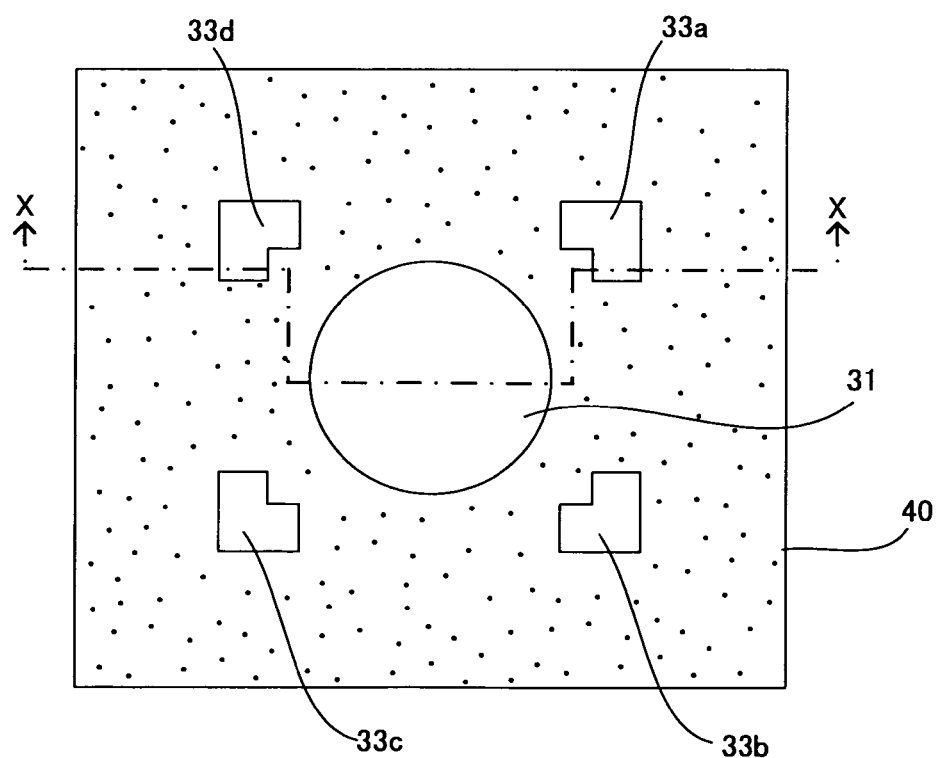
FIG. 15B is a vertical cross-sectional view showing a modification of Example 9 of the image pickup apparatus of the present invention.

The ninth Example of the image pickup apparatus of the present invention is shown in FIGS. 15A and 15B. FIG. 15A is a cross-sectional view taken along X-X line in FIG. 15B.

In an image pickup apparatus 900 shown in FIG. 15A the image pickup device 20 is mounted on one main surface (upper surface) of the support board 10, and is fixed to it with the die bonding material 12. The electrode of the image pickup device 20 and the electrode of the support board 10 are connected together with the wires 16.

The lens component 30 made of synthetic quartz glass is mounted on the image pickup device 20, and is fixed to it with the adhesive 22.

The circumferential surface of the lens component 30, the exposed surface of the image pickup device 20, and the surface of the support board 10 around the image pickup device 20 are all sealed with the sealing resin 40, encapsulating the wires 16.

Meanwhile, the external connection terminals 50 are provided on the other main surface (lower surface) of the support board 10.

In this configuration the support board 10 is formed of an insulating layer, which is a support, and is provided with a wiring layer (or a multilayered wiring layer on an as-needed basis) on one or both sides, where one of the main surfaces thereof is provided with electrode pads to be connected to the electrode of image pickup device 20 and the other main surface with electrode pads on which external connection terminals are to be formed.

In addition, the image pickup device 20 is a CCD or MOS type image pickup device, and is formed through a well-known semiconductor manufacturing process.

Although not shown, a plurality of picture elements (pixels) is formed on the light receiving region of the image pickup device 20, and color filters and microlens are placed thereon for each of the picture elements.

Furthermore, the lens component 30 has the lens part 31 (a biconvex lens in the shown Example) corresponding to the light receiving region of the image pickup device 20, and the lens barrel part 32 (lens barrel-shaped support) which extends in one direction of the optical axis of the lens part 31 to support the lens part 31 and which has a length that allows the lens part 31 to be located at the appropriate position relative to the light receiving region (i.e., at the appropriate distance (or height) from the light receiving region) when placed on the light receiving region of the image pickup device 20.

Furthermore, in this Example, the protrusion part 33 is provided around the lens part 31, the protrusion part 33 extending in the other direction of the optical axis of the lens part 31 and having a height (distance) from the surface of the image pickup device 20, which is smaller than the height of the top part 31A of the lens part 31 formed of a convex lens.

The lens barrel part 32 is made of synthetic quartz glass, the same material as the lens part 31, and is formed together with the lens part 31; in this Example its planar shape (the shape on a planar surface which is in parallel with the surface of the image pickup device 20) is rectangular. The lens barrel part 32 is of such a dimension as to surround at least the light receiving region of the image pickup device 20.

Meanwhile, the protrusion part 33 is made of the same material as the lens barrel part 32, formed together with the lens part 31 and lens barrel part 32, and is selectively provided around the light receiving part formed of the convex lens. In this Example, four protrusion parts (33a to 33d) are provided at positions corresponding to four corners of the image pickup device 20.

In addition, the infrared ray (IR) film 36 is provided in the space (gap) created between the image pickup device 20 and the lens part 31 of the lens component 30.

The circumferential surface of the lens component 30, the base part 31B of the convex lens, the circumferential surface of the protrusion part 33, the exposed surface of the image pickup device 20, and the surface of the support board 10 around the image pickup device 20 are all sealed with the sealing resin 40, encapsulating the wires 16. The sealing resin 40 fills the mold 60 to nearly the level of the top planar surface of the protrusion part 33, and covers around the base part 31B of the convex lens of the lens part 31 as well.

Thus, the top part 31A of the convex lens protrudes to a height of "H" from the surface of the sealing resin 40 (the top planar surface of the protrusion part 33).

In addition, the external connection terminals 50 made of a solder ball are provided on the other main surface of the support board 10.

In the image pickup apparatus 900 the base part 31B of the convex lens of the lens component 30 is covered with the sealing resin 40, and thereby the amount of light entering the lens part 31 is limited. Specifically, the sealing resin 40 covering the base part 31B of the convex lens functions as a diaphragm.

For this reason, there is no need to provide the light shielding plate for diaphragm 35 separately in this configuration, and thus it is possible to manufacture the image pickup apparatus inexpensively.

An example of a method of manufacturing the image pickup apparatus 900 according to the ninth Example of the present invention shown in FIGS. 15A and 15B will be described with reference to the drawings.

Figure 16:
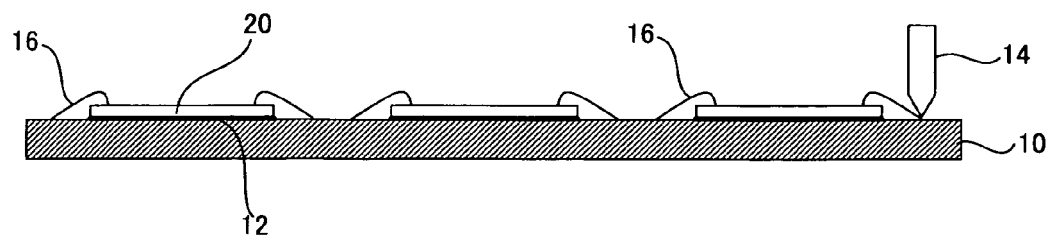
FIG. 16 is a process cross-sectional view (No. 1) for explaining a process in an example of a method of manufacturing the image pickup apparatus of the present invention (Example 9).

As shown in FIG. 16, the image pickup device 20 is first fixed onto one main surface of the support board 10 by use of the die bonding material 12. Wire bonding is then performed using the bonding capillary 14 to connect the electrode pads of the image pickup device 20 to the electrode of the support board 10.

As described above, the image pickup device 20 is a CCD or MOS type image pickup device, and is formed through a well-known semiconductor manufacturing process. The support board 10 is formed of, for example, glass epoxy resin, a support material, and has a wiring layer (or wiring layers stacked on top of each other) on one or both sides, and unillustrated lands (electrode pads) are provided on the both sides. For the wires 16, gold (Au) wires can be adopted, for example.

Here, for the purpose of forming a plurality of image pickup apparatuses at a time, a large support board is used for the support board 10, on which wires, lands and the like are previously formed in numbers enough to form a plurality of image pickup devices.

Figure 17:
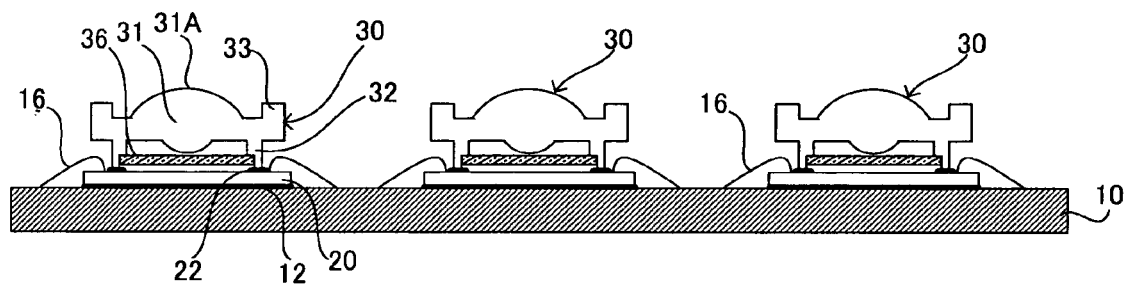
FIG. 17 is a process cross-sectional view (No. 2) for explaining a process in the example of the method of manufacturing the image pickup apparatus of the present invention (Example 9).

Next, as shown in FIG. 17, the lens component 30 is fixed onto the main surface (the surface on which the light receiving region is formed) of the image device 20 by use of the adhesive 22.

Here, the lens component 30 is made of synthetic quartz glass and, as described above, has the lens part 31 (convex lens), the lens barrel part 32 which supports the lens part 31 and positions it at the appropriate position relative to the light receiving region, and the plurality of protrusion parts 33 which are positioned across the lens part 31 from the image pickup device 20 and are positioned lower than the top point (top part 31A) of the light receiving part formed of the convex lens.

In addition, the lens barrel part 32 is provided with a step part on the inner circumferential surface, and the infrared ray (IR) filter 36 is previously attached to and fixed to the step part.

The lens barrel part 32 is fixed onto the image pickup device 20 in such a way that it surrounds the light receiving region of the image pickup device 20 and that the incoming light passing through the lens part 31 can reach the light receiving region more efficiently.

Figure 18:
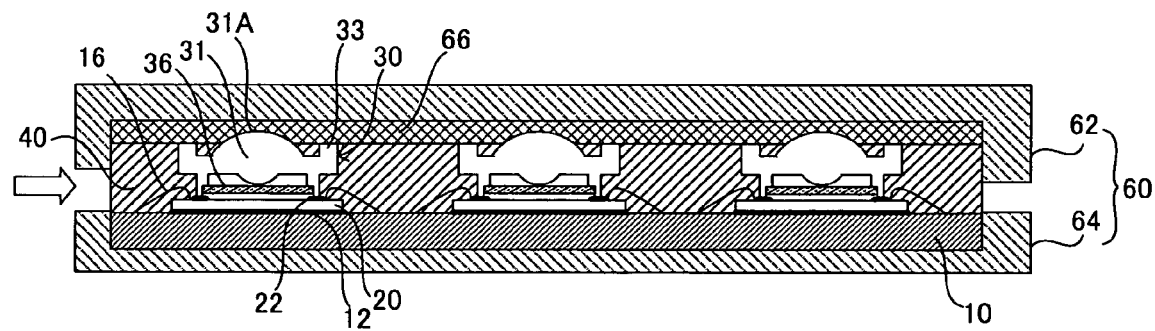
FIG. 18 is a process cross-sectional view (No. 3) for explaining a process in the example of the method of manufacturing the image pickup apparatus of the present invention (Example 9).

Next, as shown in FIG. 18, the support board 10 is attached to the mold 60, and a molding process is carried out by injecting sealing resin in the mold 60 (in the direction indicated by the arrow in FIG. 18) from a resin pod (not shown) connected to it. By this molding process, the main surfaces of the support board 10, the lens component 30, and the image pickup device 20 are all sealed with the sealing resin. The state of the support board 10 after sealed with the resin in the mold 60 is shown in FIG. 18.

Here, the mold 60 has the upper and lower molds 62 and 64. The mold 60 is attached to the support board 10 after providing a film 66 with an elasticity (hereinafter referred to as an "elastic film 66") to the inner surface of the upper mold 62 facing the lens component 30, with the second main surface (back surface) of the support board 10 brought come in contact with the inner surface of the lower mold 64. In this state the sealing resin 40 is injected in the mold 60 by transfer molding. In this way the lens component 30 and image pickup device 20 are sealed with the resin.

During the molding process, the top part of the lens part 31 of the lens component 30 is pressed into the elastic film 66, whereas the tip part of the protrusion part 33 of the lens component 30 is in contact with the surface of the elastic film 66.

Accordingly, the resin 40 thus injected never reaches the top part of the lens part 31, but covers around the protrusion part 33 as well as the base part (portion 31B shown in FIG. 15A) of the convex lens.

Figure 19:
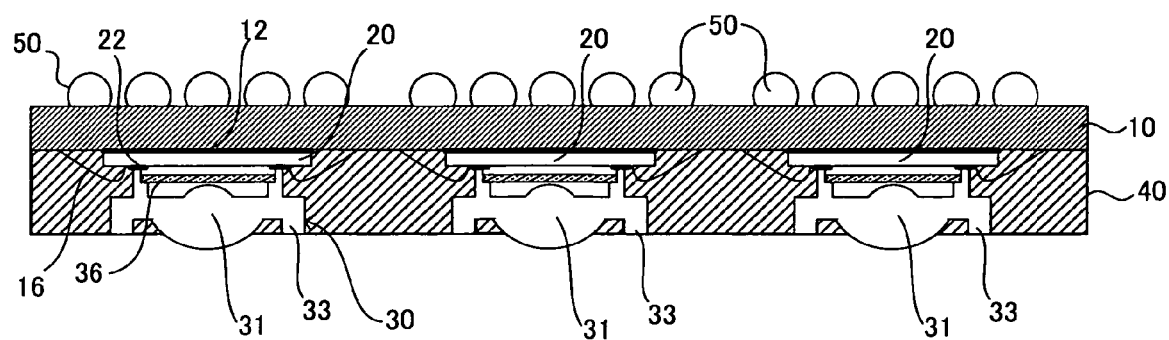
FIG. 19 is a process cross-sectional view (No. 4) for explaining a process in the example of the method of manufacturing the image pickup apparatus of the present invention (Example 9).

After the sealing resin 40 is cured, the support board 10 is taken out of the mold 60, and a solder ball, the external connection terminal 50, is formed for each of the plurality of lands formed on the other main surface of the support board 10, as shown in FIG. 19.

Figure 20:
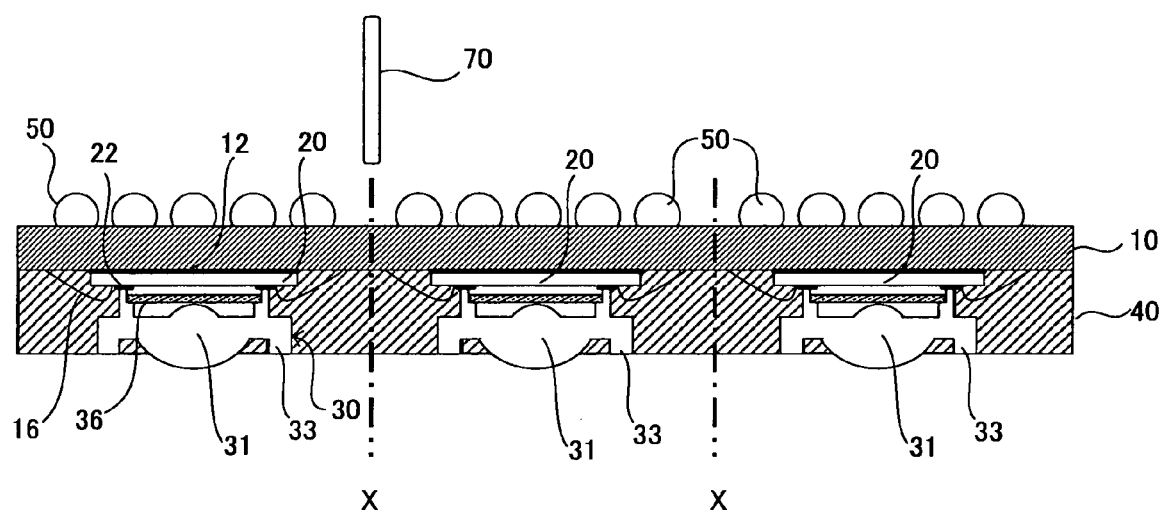
FIG. 20 is a process cross-sectional view (No. 5) for explaining a process in the example of the method of manufacturing the image pickup apparatus of the present invention (Example 9).

Using the dicing blade 70, the support board 10 and sealing resin 40 are then cut along dicing lines X into a plurality of distinct image pickup apparatuses 900 (package dicing), as shown in FIG. 20.

Figure 21:
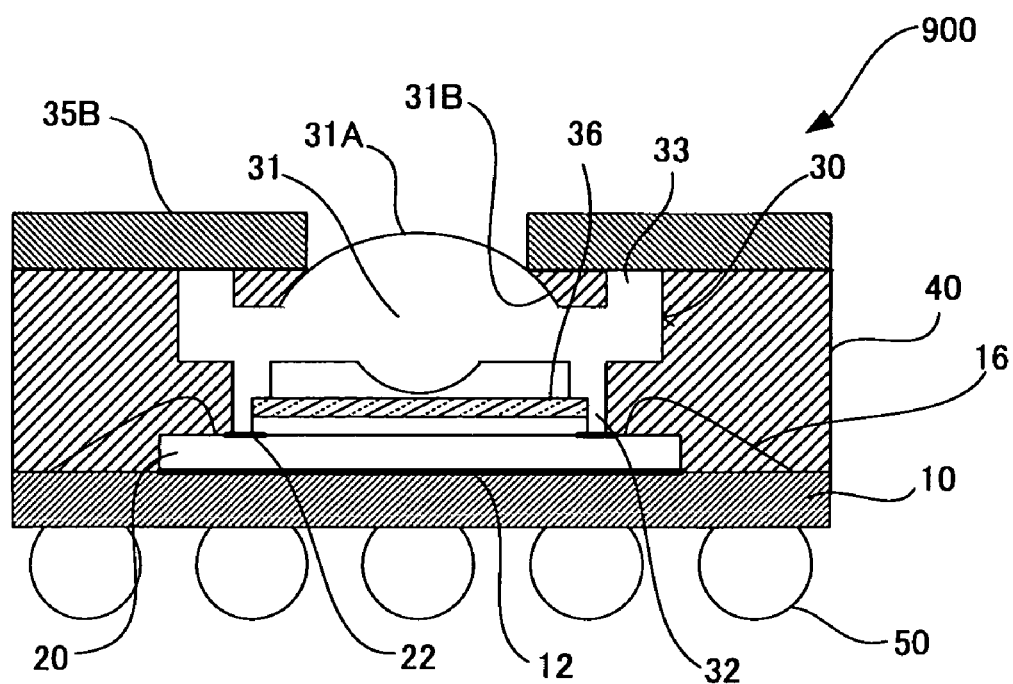
FIG. 21 is a vertical cross-sectional view showing a modification of Example 9 of the image pickup apparatus of the present invention.

A light shielding layer 35B is then provided to each image pickup apparatus 900 in such a way as to cover the protrusion part 33 of the lens component 30 and the sealing resin 40. In this way an image pickup device structure shown in FIG. 21 is obtained.

The light shielding layer 35B has a thickness greater than the height "H" shown in FIG. 15A, which is the amount of the convex lens protruding from the sealing resin 40, and thus attachment of the light shielding layer 35B prevents the lens part 31 from protruding, thereby significantly reducing the likelihood that external forces are applied to the lens part 31.

In addition, attachment of the light shielding layer 35B also prevents external light from reaching the image pickup device 20 via the protrusion part 33.

Further modifications can be made to the image pickup apparatus of the present invention thus obtained, as shown in Examples described below.

Specifically, although the protrusion part 33 is selectively provided around the lens part 31 in Example 9, it is provided in a continuous wall-shape in a case where there is no need to allow the sealing resin 40 to reach the base part 31B of the convex lens of the lens part 31.

Figure 22:
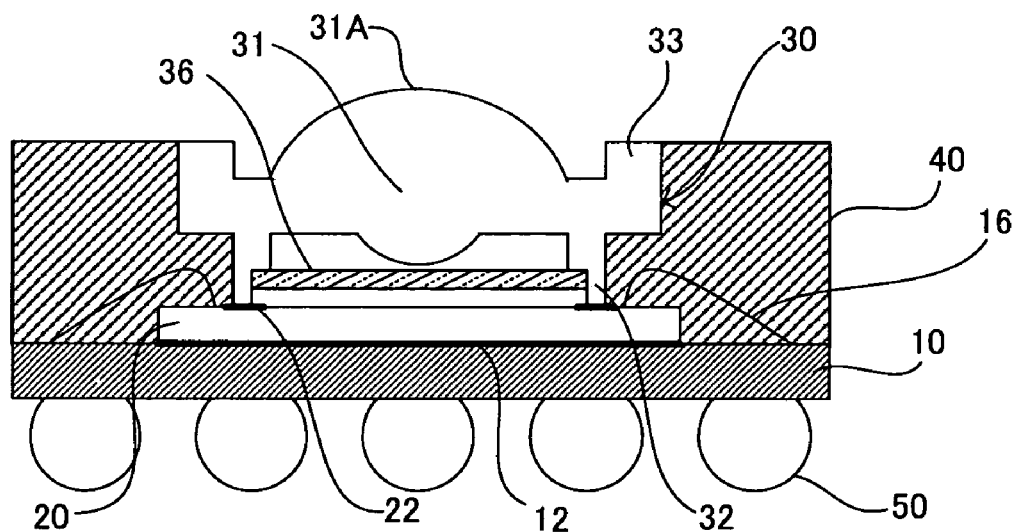
FIG. 22 is a vertical cross-sectional view showing another modification of Example 9 of the image pickup apparatus of the present invention.

Thus, it is possible to obtain the image pickup apparatus shown in FIG. 22 by providing the protrusion part 33 around the lens part 31 in a continuous wall-shape and by performing a resin molding process using the mold shown in FIG. 18.

In the structure shown in FIG. 22 (which is a modification of the ninth Example), the sealing resin 40 is not present at the base part (31B) of the convex lens of the lens part 31 positioned inside the protrusion part 33.

Figure 23:
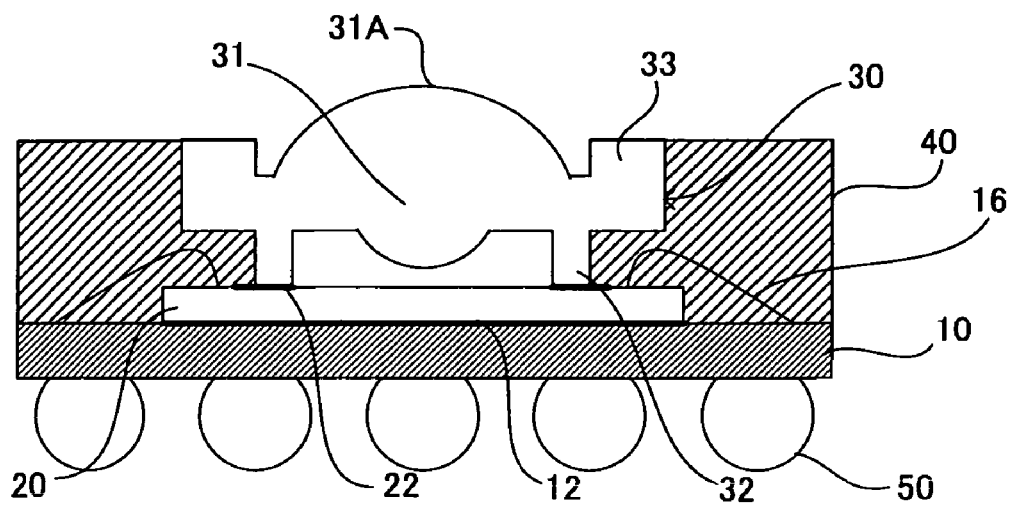
FIG. 23 is a vertical cross-sectional view showing still another modification of Example 9 of the image pickup apparatus of the present invention.

FIG. 23 shows a structure of the image pickup apparatus of the present invention, where the infrared ray (IR) filter 36 is not provided between the lens part 31 and the image pickup device 20.

Figure 24:
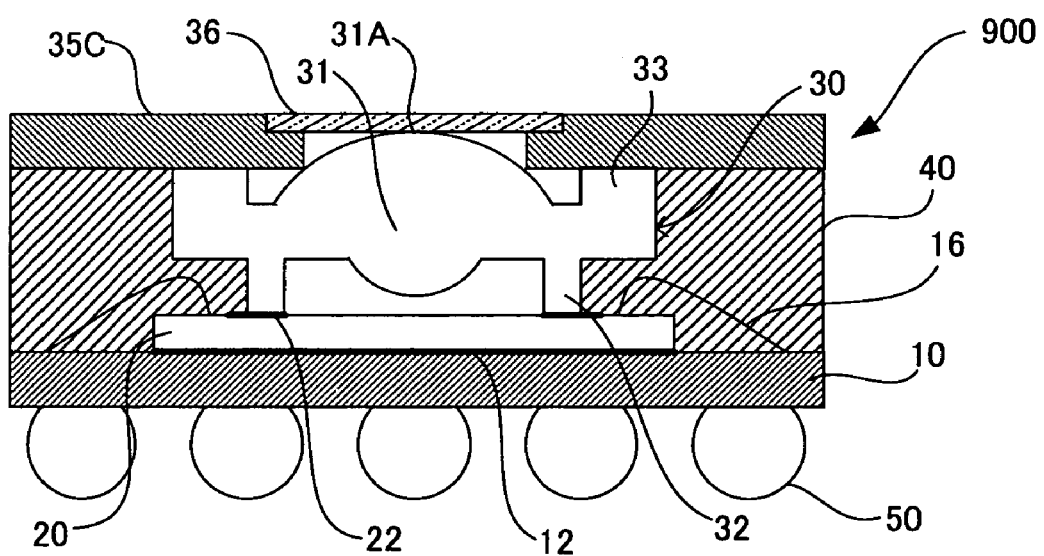
FIG. 24 is a vertical cross-sectional view showing yet another modification of Example 9 of the image pickup apparatus of the present invention.

Furthermore, FIG. 24 shows a structure of the image pickup apparatus of the present invention, where a light shielding layer 35C is provided in such a way as to cover the protrusion part 33 of the lens component 30.

As in the case of the configuration shown in FIG. 21, the light shielding layer 35C also has a thickness greater than the height "H" shown in FIG. 15A, which is the amount of the convex lens protruding from the sealing resin 40, allowing the infrared ray (IR) filter 36 to be provided on the top part 31A of the lens part 31.

This structure also significantly reduces the likelihood that external forces are applied to the lens part 31.

Moreover, attachment of the light shielding layer 35C prevents external light from reaching the image pickup device 20 via the protrusion part 33.

Figure 25:
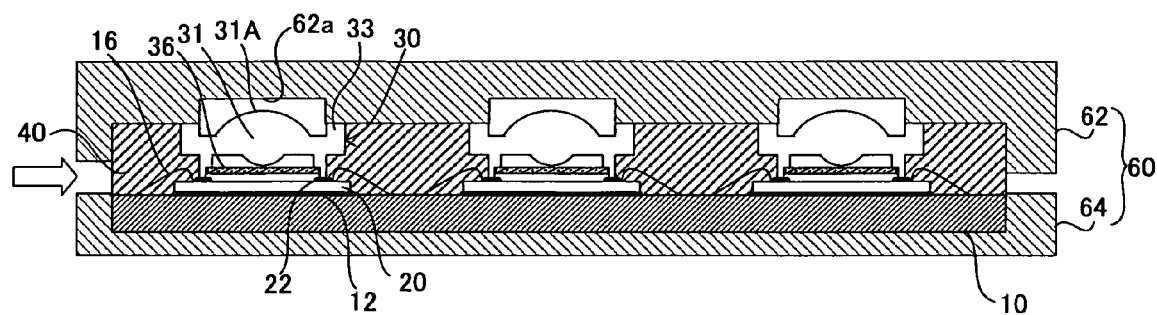
FIG. 25 is a process cross-sectional view showing a modification of a mold shown in FIG. 18.

Note that upon formation of the image pickup apparatuses shown in FIGS. 22 to 24, the mold 60 with a configuration shown in FIG. 25 can also be used in place of the mold shown in FIG. 18.

As shown in these drawings, a concave part 62a for receiving the convex lens of the lens part 31 is provided on the inner surface of the upper mold 62 of the mold 60. When the support board 10 is housed in the mold 60, the lens part 31 of the lens component 30 is received by the concave part 62a, and the wall-shaped protrusion part 33 around the lens part 31 comes in contact with the inner surface of the mold 60 at a position around the concave part 62a.

Thus, the protrusion part 33 prevents the sealing resin 40 injected in the mold 60 from flowing toward the lens part 31.

Figure 26:
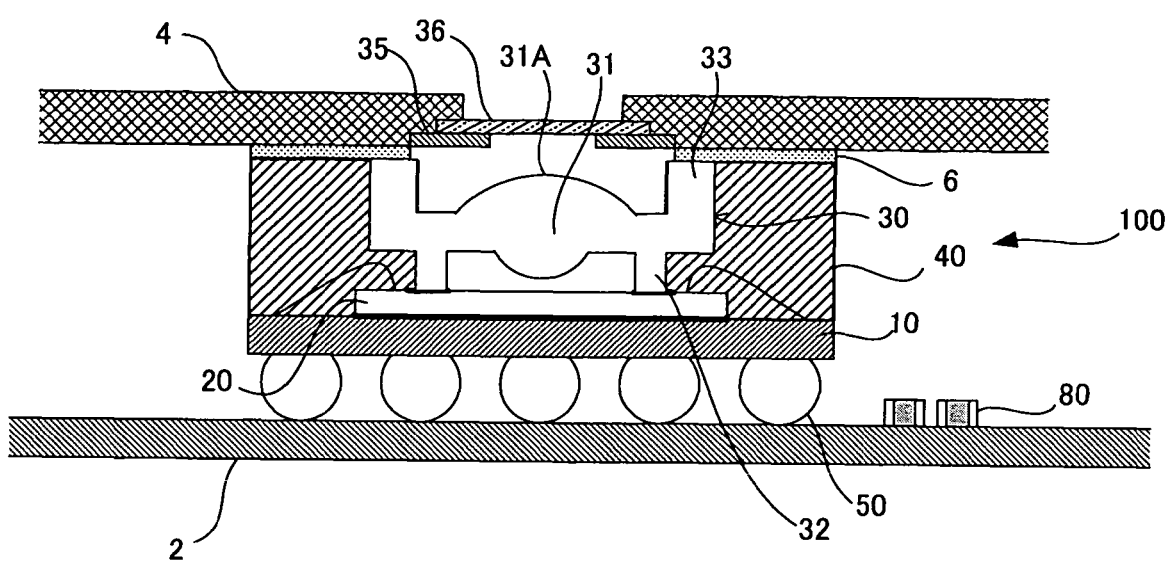
FIG. 26 is a vertical cross-sectional schematic view showing an example of application of the image pickup apparatus of the present invention, where it is mounted on an electronic device.

An example of a state of the image pickup apparatus 100 shown in Example 1, where it is mounted on an electronic device such as a cellular phone, is shown in FIG. 26.

In this drawing the image pickup apparatus 100 is connected to and fixed to a mounting board 2 in a cellular phone with the external connection terminals 50. On the mounting board 2, the electronic components 80 such as capacitors are provided near the image pickup device 20 on an as-needed basis.

Meanwhile, the light shielding plate for diaphragm 35 and infrared ray (IR) filter 36 are previously fixed to predetermined positions of the case or cover 4 of the cellular phone.

The image pickup apparatus 100 is fixed to the case or cover 4 of the cellular phone with a cushion material 6 in such a way that it faces the center of the infrared ray (IR) filter 36, i.e., in such a way that its optical axis exactly comes to the center of the infrared ray (IR) filter 36 where the light shielding plate for diaphragm 35 regulates the degree of the opening.

In image pickup device-mounted cellular phones having such a structure, generation of protrusion parts from, for example, the convex lens of the lens part 31 is prevented during the manufacturing process for the image pickup apparatus 100, thereby preventing the reduction in the optical characteristics.

Thus, it is possible to provide an image pickup apparatus with excellent optical characteristics inexpensively and stably.

According to the present invention, it is possible to solve the conventional problems and to provide an image pickup apparatus which can be miniaturized, and has excellent optical characteristics as well as high reliability, and a method of manufacturing an image pickup apparatus, which is capable of efficiently manufacturing the image pickup apparatus in large quantities.

The image pickup apparatus of the present invention has excellent optical characteristics and high reliability, can be provided inexpensively, and thus can be applied to digital cameras, digital movie cameras, camera-mounted cellular phones or scanners.

According to the method of the present invention for manufacturing an image pickup apparatus, it is possible to inexpensively provide an image pickup apparatus with excellent optical characteristics and high reliability.

What is claimed is:

1. An image pickup apparatus comprising:
a support board,
an image pickup device mounted on the support board, and
a lens component provided on a light receiving region of the image pickup device,
wherein the lens component has a protrusion part provided around a lens part, the height of the protrusion part from the surface of the image pickup device is greater than the height of the top part of the lens part from the surface of the image pickup device, the image pickup device is interposed between the support board and the lens component, the lens component is directly in contact with the image pickup device, the image pickup device and the support board are connected together with a wire, an exposed circumferential surface of the lens component, an exposed upper and circumferential surfaces of the image pickup device, and an exposed upper surface of the support board around the image pickup device are covered with a sealing resin, the wire is encapsulated with the sealing resin, and the sealing resin has a height from a surface of the support board which is equal to the height of the protrusion part from the surface of the image pickup device.

2. The image pickup apparatus according to claim 1, wherein the lens component comprises:
the lens part,
a lens barrel part extending from the lens part in one direction of the optical axis thereof, and
the protrusion part extending from the lens part in the other direction of the optical axis thereof.

\* \* \* \* \*